United States Patent [19]
Matsumoto et al.

[11] Patent Number: 5,956,859
[45] Date of Patent: Sep. 28, 1999

[54] DRYING APPARATUS FOR PROCESSING SURFACE OF SUBSTRATE

[75] Inventors: Akinori Matsumoto; Takeshi Kuroda, both of Hyogo; Cozy Ban, Tokyo; Toko Konishi, Tokyo; Naoki Yokoi, Tokyo, all of Japan

[73] Assignees: Ryoden Semiconductor System Emgineering Corporation, Itami; Mitsubishi Denki Kabushiki Kaisha, Tokyo, both of Japan

[21] Appl. No.: 08/960,033

[22] Filed: Oct. 28, 1997

[30] Foreign Application Priority Data

May 22, 1997 [JP] Japan .................................. 9-132045

[51] Int. Cl.⁶ .................................................. F26B 21/06
[52] U.S. Cl. .................................. 34/74; 34/78; 34/208; 34/210
[58] Field of Search .............................. 34/337, 343, 348, 34/351, 360, 364, 370, 381, 402, 73, 74, 75, 76, 77, 78, 202, 210; 134/105, 108, 902

[56] References Cited

U.S. PATENT DOCUMENTS 5,183,067  2/1993  Slinn ........................................ 134/61
5,369,891  12/1994  Kamikawa .................................. 34/78
5,535,525  7/1996  Gardner ..................................... 34/78
5,608,974  3/1997  Tanaka et al. .............................. 34/78
5,657,553  8/1997  Tarui et al. ................................. 34/78

FOREIGN PATENT DOCUMENTS 61-241927  10/1986  Japan .
3-70134    3/1991   Japan .
4-79223    3/1992   Japan .
6-77203    3/1994   Japan .

*Primary Examiner*—Henry Bennett
*Assistant Examiner*—Steve Gravini
*Attorney, Agent, or Firm*—Oblon, Spivak, McClelland, Maier & Neustadt, P.C.

[57] ABSTRACT

A drying apparatus for processing a surface of a substrate wherein, when a nitrogen gas is fed to a nozzle, a jet of the nitrogen gas spouted through a jet hole is generated. The jet becomes film-shaped and is projected upwardly along an inner surface of a side wall of a processing vessel. Then, the jet is collected into an outside through a suction port formed in an upper portion of the processing vessel. The inner surface of the side wall of the processing vessel is covered with the jet. Therefore, an IPA vapor can be prevented from condensing uselessly on the inner surface. As a result, the IPA vapor is effectively utilized for condensation on a surface of the object to be processed which is mounted on a pan. Thus, defective dryness of the object can be prevented.

18 Claims, 18 Drawing Sheets

DRYING APPARATUS FOR PROCESSING SURFACE OF SUBSTRATE

BACKGROUND OF THE INVENTION

1. Field of the Invention

The present invention relates to a drying technique suitable for drying a semiconductor wafer, and more particularly to improvement to prevent defective dryness.

2. Description of the Background Art

FIG. 22 is a front sectional view showing a structure of a drying apparatus according to the prior art which is part of the background of the present invention. A drying apparatus 151 is formed to dry a semiconductor wafer. The drying apparatus 151 comprises a processing vessel 171 having an upper end opened. A cooling coil 162 is attached to an inside of an upper portion of a side wall of the processing vessel 171 along the side wall of the processing vessel 171. The cooling coil 162 is formed of a silica tube, in which cooling water is caused to flow.

A heater 170 is provided just below a bottom portion of the processing vessel 171. Furthermore, a pan 166 is fixed to a position between the bottom portion and an upper open end in the processing vessel 171. A pipe 180 for drain is connected to a bottom portion of the pan 166.

When using the drying apparatus 151, an IPA (isopropyl alcohol) 167 is first poured into the processing vessel 171. A depth of the processing vessel 171 is regulated in such a manner that a liquid level does not reach the bottom portion of the pan 166. The cooling water is caused to flow in the cooling coil 162.

When the heater 170 is turned on, the IPA 167 is heated. As a result, the IPA 167 is vaporized so that an IPA vapor 165 is generated. The IPA vapor 165 is filled into the processing vessel 171. The IPA vapor 165 is cooled and condenses in the vicinity of the cooling coil 162. More specifically, the cooling coil 162 serves to prevent the IPA vapor 165 from leaking out of the processing vessel 171.

Accordingly, the IPA 167 is stored in a liquid storing section 169 provided in the vicinity of the bottom portion of the processing vessel 171, and the IPA vapor 165 is filled into a vapor filling section 168 from a top of the IPA 167 to the vicinity of the cooling coil 162. After the IPA vapor 165 is filled into the vapor filling section 168, a processing is started for a semiconductor wafer 163 to be processed. After a rinsing processing is completed, a lot of semiconductor wafers 163 and a cassette 164 carrying them are suspended from a holding arm 161 and are inserted into the vapor filling section 168 from above the processing vessel 171. The cassette 164 carrying the semiconductor wafers 163 is held by the holding arm 161 just above the pan 166 as shown in FIG. 22.

Consequently, the IPA vapor 165 filled in the vapor filling section 168 condenses and dissolves into waterdrops which stick to surfaces of the semiconductor wafers 163 and the cassette 164. As a result, the waterdrops are essentially changed to IPA droplets. The IPA droplets slip from the surfaces of the semiconductor wafers 163 and the cassette 164. Thus, the semiconductor wafers 163 and the cassette 164 which are wet with the waterdrops can be dried. The slipping IPA droplets are collected by the pan 166 and are then discharged to an outside through the pipe 180.

When the drying processing is completed, the cassette 164 is pulled up by the holding arm 161 and is taken out of the processing vessel 171. Then, the cassette 164 thus taken out is delivered to a next processing step. Thereafter, new (i.e. unprocessed) semiconductor wafers 163 and a new cassette 164 are put in the processing vessel 171. Thus, the semiconductor wafers 163 and the cassette 164 are dried repeatedly.

In the drying apparatus 151 according to the prior art, the IPA vapor 165 condenses in unnecessary portions such as a surface of an internal wall of the processing vessel 171 as well as the semiconductor wafer 163 acting as an object to be processed which has been put. In addition, the flow of the IPA vapor 165 is obstructed by the pan 166. For this reason, the IPA vapor 165 does not fully condense on the semiconductor wafer 163. As a result, the drying processing is occasionally not fully performed so that defective dryness is caused. Consequently, yield of a semiconductor device manufactured in the semiconductor wafer 163 is deteriorated.

SUMMARY OF THE INVENTION

A first aspect of the present invention is directed to a drying apparatus for storing and heating a water-soluble solvent, and causing a vapor generated from the solvent to condense on a surface of an object to be processed, thereby drying the surface of the object, comprising a processing vessel defining, on a top, an upward opening through which the object can be put in and out, and capable of storing the solvent in a bottom portion and of housing the object above the stored solvent.

The drying apparatus further comprises a heater capable of heating the solvent stored in the bottom portion of the processing vessel, diffusion preventing means for preventing the vapor from diffusing from an inside of the processing vessel to an outside thereof through the opening, and a nozzle capable of generating a flow of a gas to cover an inner surface of a side wall of the processing vessel along the inner surface on receipt of a supply of the gas, wherein the processing vessel further defines, on the side wall, a suction port capable of collecting the gas which has flown along the inner surface A second aspect of the present invention is directed to the drying apparatus according to the first aspect of the present invention, wherein the nozzle is provided in a lower portion of the side wall and the suction port is defined in an upper portion of the side wall such that the gas can be collected by the suction port after flowing so as to cover the inner surface from a lower portion to an upper portion along the inner surface.

A third aspect of the present invention is directed to the drying apparatus according to the first aspect of the present invention, wherein the nozzle is provided in an upper portion of the side wall and the suction port is defined in the upper portion of the side wall such that the gas can be collected by the suction port through a portion in which the object is housed after flowing so as to cover the inner surface from an upper portion to a lower portion along the inner surface.

A fourth aspect of the present invention is directed to the drying apparatus according to any of the first to third aspects of the present invention, further comprising sucking means and mixed gas generating means, wherein the sucking means is inserted between the suction port and the mixed gas generating means and sucks the inside of the processing vessel through the suction port, and the mixed gas generating means is inserted between the sucking means and the nozzle, feeds a mixed gas of a nonreactive gas and the vapor as the gas to the nozzle, and increases the concentration of the vapor in the mixed gas sucked by the sucking means and thereafter feeds the mixed gas to the nozzle.

A fifth aspect of the present invention is directed to the drying apparatus according to the fourth aspect of the present invention, further comprising a mixed gas pipe inserted between the mixed gas generating means and the nozzle for delivering the mixed gas, and a second heater provided separately from the heater which is referred to as a first heater and fixed to the mixed gas pipe for heating the mixed gas delivered through the mixed gas pipe.

A sixth aspect of the present invention is directed to the drying apparatus according to the fifth aspect of the present invention, wherein the mixed gas generating means includes a mixing vessel capable of storing the solvent, and a third heater for heating the solvent stored in the mixing vessel to generate a vapor of the solvent.

The mixing vessel mixes the vapor generated from the solvent stored in the mixing vessel into the mixed gas sucked by the sucking means, thereby increasing the concentration of the vapor in the mixed gas, the drying apparatus further comprising a concentration sensor for detecting the concentration of the vapor in the mixed gas passing through the suction port, and control means for controlling heat outputs of the first to third heaters so as to eliminate a deviation from a target value of the concentration detected by the concentration sensor.

A seventh aspect of the present invention is directed to the drying apparatus according to the sixth aspect of the present invention, wherein the control means controls a suction output of the sucking means in addition to the heat outputs of the first to third heaters so as to eliminate the deviation from the target value of the concentration detected by the concentration sensor.

An eighth aspect of the present invention is directed to the drying apparatus according to the second aspect of the present invention, further comprising a rectifying member fixed to the side wall for changing a direction of the flow such that the gas goes toward a portion in which the object is housed after flowing so as to cover the inner surface from the lower portion to the upper portion along the inner surface.

A ninth aspect of the present invention is directed to the drying apparatus according to any of the first to eighth aspects of the present invention, wherein the nozzle includes a plurality of pipes combined in multiple ways from an inside to an outside, each of the pipes defines a plurality of jet holes arranged along a central axis so that the gas fed to an innermost pipe is sequentially fed to outer pipes through the jet holes and is spouted along the inner surface of the side wall through the jet holes defined on an outermost pipe, and the jet holes defined between any one of the pipes and an outer pipe thereof are provided opposite to each other.

A tenth aspect of the present invention is directed to a drying apparatus for storing and heating a water-soluble solvent, and causing a vapor generated from the solvent to condense on a surface of an object to be processed, thereby drying the surface of the object, comprising a processing vessel defining, on a top, an upward opening through which the object can be put in and out, and capable of storing the solvent in a bottom portion and of housing the object above the stored solvent.

The drying apparatus further comprises a heater capable of heating the solvent stored in the bottom portion of the processing vessel, diffusion preventing means for preventing the vapor from diffusing from an inside of the processing vessel to an outside thereof through the opening, and a second nozzle, respectively referring to said nozzle and said gas as a first nozzle and a first gas, being capable of spouting a gas into the solvent stored in the processing vessel to bubble the solvent on receipt of a supply of the second gas.

An eleventh aspect of the present invention is directed to the drying apparatus according to the tenth aspect of the present invention, wherein the second nozzle is divided into a plurality of unit nozzles.

A twelfth aspect of the present invention is directed to the drying apparatus according to the tenth or eleventh aspect of the present invention, further comprising another nozzle capable of generating a flow of the gas to cover an inner surface of the side wall of the processing vessel along the inner surface on receipt of a supply of the gas, wherein the nozzle and the another nozzle communicate with each other so that a common gas can be fed as the gas to the nozzles at the same time.

A thirteenth aspect of the present invention is directed to a drying apparatus for storing and heating a water-soluble solvent, and causing a vapor generated from the solvent to condense on a surface of an object to be processed, thereby drying the surface of the object, comprising a processing vessel defining, on a top, an upward opening through which the object can be put in and out, and capable of storing the solvent in a bottom portion and of housing the object above the stored solvent.

The drying apparatus further comprises a heater capable of heating the solvent stored in the bottom portion of the processing vessel, diffusion preventing means for preventing the vapor from diffusing from an inside of the processing vessel to an outside thereof through the opening, a pan provided under the object which is housed in the processing vessel, and above a liquid level of the stored solvent, and a pipe coupled to a bottom portion of the pan for discharging a liquid poured into the pan to an outside of the drying apparatus, wherein the pan is formed of a material which is permeable to a gas and impermeable to a liquid.

A fourteenth aspect of the present invention is directed to a drying apparatus for storing and heating a water-soluble solvent, and causing a vapor generated from the solvent to condense on a surface of an object to be processed, thereby drying the surface of the object, comprising a processing vessel defining, on a top, an upward opening through which the object can be put in and out, and capable of storing the solvent in a bottom portion and of housing the object above the stored solvent.

The drying apparatus further comprises a heater capable of heating the solvent stored in the bottom portion of the processing vessel, diffusion preventing means for preventing the vapor from diffusing from an inside of the processing vessel to an outside thereof through the opening, a pan provided under the object which is housed in the processing vessel, and above a liquid level of the stored solvent, and a pipe coupled to a bottom portion of the pan for discharging a liquid poured into the pan to an outside of the drying apparatus.

In addition, the pan includes a first flat plate which is bent to have a V - type section or an inverted V - type section, and a plurality of second flat plates arranged on both sides of the first plate symmetrically around the first plate at regular intervals so as to respectively have a V - type section or an inverted V - type section as a whole including the first plate.

A fifteenth aspect of the present invention is directed to the drying apparatus according to the fourteenth aspect of the present invention, wherein the pan further includes a rectifying member fixed outside the second plates provided in the most distant position from the first plate, that is, in an outermost position for causing a flow of the vapor going upward from a space below the pan to converge.

A sixteenth aspect of the present invention is directed to the drying apparatus according to any of the thirteenth to fifteenth aspects of the present invention, further comprising a nozzle capable of generating a flow of a gas to cover an inner surface of a side wall of the processing vessel along the inner surface on receipt of a supply of the gas.

The processing vessel further defines, on the side wall, a suction port capable of collecting the gas after flowing along the inner surface, and the nozzle is provided in an upper portion of the side wall and the suction port is defined in the upper portion of the side wall such that the gas can be collected by the suction port through a portion in which the object is housed after flowing so as to cover the inner surface from the upper portion to a lower portion along the inner surface.

A seventeenth aspect of the present invention is directed to the drying apparatus according to any of the thirteenth to fifteenth aspects of the present invention, further comprising a nozzle capable of spouting a gas into the solvent stored in the processing vessel to bubble the solvent on receipt of a supply of the gas, wherein the processing vessel further defines, on a side wall, a suction port capable of collecting the gas after bubbling.

An eighteenth aspect of the present invention is directed to the drying apparatus according to any of the first to seventeenth aspects of the present invention, wherein the diffusion preventing means includes spouting means and exhaust means provided opposite to each other with the opening interposed therebetween, the exhaust means defines an exhaust port for opening toward the spouting means, the spouting means can generate a jet of a second gas going toward the exhaust port, referring to said gas as a first gas, and covering the opening on receipt of a supply of the second gas, the exhaust means can discharge, to an outside, the gas body sucked through the exhaust port, and the side wall of the processing vessel has a curved portion which is smoothly curved inward as the opening is approached upward.

A nineteenth aspect of the present invention is directed to the drying apparatus according to the eighteenth aspect of the present invention, wherein the diffusion preventing means further includes a cap for freely covering the opening.

A twentieth aspect of the present invention is directed to a method for processing a surface of a substrate, comprising the steps of preparing a processing vessel defining, on a top, an upward opening which can put in and out the substrate, and capable of storing a solvent in a bottom portion and of housing the substrate above the stored solvent, preparing a heater capable of heating the solvent stored in the bottom portion of the processing vessel, preparing a diffusion preventing means for preventing a vapor of the solvent from diffusing from an inside of the processing vessel to an outside thereof through the opening, and preparing a nozzle capable of generating a flow of a gas to cover an inner surface of a side wall of the processing vessel along the inner surface on receipt of a supply of the gas, wherein the processing vessel further defines, on the side wall, a suction port capable of collecting the gas which has flown along the inner surface, wherein the method further comprises steps of feeding the solvent into the processing vessel, thereby storing the solvent in a part of the processing vessel, driving the diffusion preventing means to work, supplying the gas to the nozzle, driving the heater to heat the solvent, inserting the substrate into the processing vessel through the opening, holding the inserted substrate above a liquid level of the solvent and drying the surface of the substrate by the vapor of the heated solvent, and taking the substrate out of the processing vessel through the opening after the drying step.

According to the first aspect of the present invention, for example, a nonreactive gas or the like is fed to the nozzle so that the flow of the gas covering the inner surface of the side wall of the processing vessel can be generated. Consequently, the vapor of the solvent can be prevented from condensing uselessly on the inner surface of the side wall. In other words, an efficiency of the vapor condensing on the object to be processed can be increased. As a result, defective dryness can be prevented.

According to the second aspect of the present invention, the flow of the gas generated by the nozzle positioned in the lower portion goes along the inner surface of the side wall of the processing vessel and is then collected by the suction port positioned in the upper portion. In other words, the flow of the gas is smooth and the flow of the vapor touching the object is disturbed with difficulty. Consequently, it is easy to dry the object stably and uniformly.

According to the third aspect of the present invention, the flow of the gas generated by the nozzle goes toward the object to be processed before it is collected by the suction port. Consequently, the vapor of the solvent is forcedly fed to the object by the flow of the gas. Therefore, the efficiency of the vapor condensing on the object can be increased still more. Thus, the defective dryness of the object can be prevented more effectively.

According to the fourth aspect of the present invention, the nonreactive gas is cyclically fed to the nozzle. Therefore, an amount of the nonreactive gas to be used can be reduced. Furthermore, the concentration of the vapor of the solvent contained in the collected gas is increased and the gas is fed to the nozzle. Therefore, it is possible to prevent the concentration of the vapor of the solvent in the processing vessel from being lowered. Consequently, the efficiency of the vapor condensing on the object can be increased still more. Thus, the defective dryness of the object can be prevented more effectively.

According to the fifth aspect of the present invention, although the mixed gas is fed from the mixed gas generating means to the nozzle through the mixed gas pipe, it is heated by the second heater. Therefore, the vapor of the solvent contained in the mixed gas can be prevented from condensing on the mixed gas pipe. Consequently, the efficiency of the vapor condensing on the object is not deteriorated and an excessive burden is not imposed on the mixed gas generating means.

According to the sixth aspect of the present invention, even if the concentration of the vapor of the solvent contained in the mixed gas collected from the processing vessel through the suction port has a deviation from the target value, the control means controls heat outputs of the first to third heaters so that the deviation can be eliminated. Consequently, it is possible to reduce a fluctuation of the concentration of the vapor of the solvent caused by putting in the object to be processed. Thus, the concentration of the vapor can be kept at an almost constant value corresponding to the target value. As a result, an amount of the vapor condensing on the object can be held nearly according to a target. Thus, the defective dryness can be prevented still more.

According to the seventh aspect of the present invention, the control means controls the suction output of the sucking means. Therefore, even if the concentration of the vapor of the solvent contained in the mixed gas collected from the processing vessel through the suction port has a deviation from the target value, the deviation can be eliminated more quickly.

According to the eighth aspect of the present invention, the gas flows, by the rectifying member fixed to the side wall of the processing vessel, toward the portion in which the object to be processed is housed. Therefore, the efficiency of the vapor of the solvent condensing on the object can further be enhanced. Accordingly, the defective dryness and the nonuniformity of the dryness can be prevented more effectively.

According to the ninth aspect of the present invention, the nozzle has a multiple structure. Therefore, the gas is spouted from each of the jet holes defined on the outermost pipe at a comparatively uniform flow velocity. In other words, a deviation of a flow rate of the gas spouted from the jet holes can be relieved or eliminated.

According to the tenth aspect of the present invention, the solvent can be bubbled by feeding the nonreactive gas to the second nozzle, for example. Consequently, the vapor can be generated from the solvent with a high efficiency. As a result, the amount of the vapor condensing on the object to be processed is increased. Thus, the defective dryness of the object to be processed can be reduced.

According to the eleventh aspect of the present invention, the second nozzle is divided into a plurality of unit nozzles. Therefore, generation of the vapor is accelerated over a wide range of the solvent. Consequently, the amount of the vapor condensing on the object to be processed can further be increased. Thus, the defective dryness of the object to be processed can be reduced still more.

According to the twelfth aspect of the present invention, the flow of the gas covering the inner surface of the side wall of the processing vessel can be generated by feeding a nonreactive gas to another nozzle, for example. Consequently, the vapor of the solvent can be prevented from condensing uselessly on the inner surface of the side wall. In other words, the efficiency of the vapor condensing on the object to be processed can be increased. As a result, defective dryness can be prevented still more.

In addition, both nozzles communicate with each other. Consequently, the common gas can be fed to the nozzles at the same time. Therefore, it is not necessary to separately provide a device for feeding an inactive gas or the like to the nozzles. In other words, a structure of the apparatus is not complicated and the defective dryness can be prevented effectively.

According to the thirteenth aspect of the present invention, the drying apparatus is provided with the pan formed of the material which is impermeable to a liquid. Therefore, droplets of the solvent containing water falling from the surface of the object to be processed are collected by the pan, and are then discharged to the outside through the pipe. Consequently, the purity of the solvent stored in the bottom portion of the processing vessel is kept high. Furthermore, the pan is formed of the material which is impermeable to a liquid and permeable to a gas. Therefore, a flow of an upward vapor which is generated from the stored solvent is not obstructed by the pan. In other words, the purity of the solvent can be held without reducing the efficiency of the vapor condensing on the object to be processed or causing nonuniformity of the flow of the vapor surrounding the object.

According to the fourteenth aspect of the present invention, the drying apparatus is provided with the pan. Therefore, droplets of the solvent containing water falling from the surface of the object to be processed are collected by the pan, and are then discharged to the outside through the pipe. Consequently, the purity of the solvent stored in the bottom portion of the processing vessel is kept high. Furthermore, the pan includes a plurality of plates arranged at regular intervals to have a V - type section or an inverted V - type section. Therefore, a flow of an upward vapor which is generated from the stored solvent is not obstructed by the pan. In other words, the purity of the solvent can be held without reducing the efficiency of the vapor condensing on the object to be processed or causing nonuniformity of the flow of the vapor surrounding the object.

According to the fifteenth aspect of the present invention, the pan is provided with the rectifying member. Therefore, the flow of the vapor generated from the stored solvent converges on the object to be processed without diffusing away from the object. Consequently, the efficiency of the vapor condensing on the object can be increased still more. Thus, the defective dryness and the nonuniformity of the dryness can be prevented more effectively.

According to the sixteenth aspect of the present invention, the flow of the gas generated by the nozzle goes toward the object to be processed before it is collected by the suction port. In addition, the flow is not obstructed by the pan. Consequently, the vapor of the solvent is not obstructed by the pan but can efficiently be fed, by the flow of the gas, to the object. As a result, the efficiency of the vapor condensing on the object can be increased still more. Thus, the defective dryness of the object can be prevented more effectively.

According to the seventeenth aspect of the present invention, the solvent can be bubbled by feeding the gas to the nozzle. Consequently, the vapor can be generated from the solvent with a high efficiency. Since the flow of the vapor going upward from the solvent is not obstructed by the pan, it is efficiently fed to the object to be processed. As a result, the efficiency of the vapor condensing on the object can be increased still more. Thus, the defective dryness of the object can be prevented more effectively.

According to the eighteenth aspect of the present invention, the nonreactive gas is fed as the second gas to the spouting means so that the jet of the nonreactive gas is generated. As a result, a kind of curtain covering the opening of the processing vessel is formed. Furthermore, the side wall of the processing vessel has a curved portion. Therefore, the vapor generated from the solvent can effectively be prevented from flowing to the outside by the curtain of the nonreactive gas.

Consequently, a cooling coil necessary for the drying apparatus according to the prior art is not required. Therefore, a state of the vapor filled in the processing vessel is stabilized. As a result, the defective dryness of the object to be processed can be prevented more effectively. Furthermore, an upper layer portion of the processing vessel necessary for providing the cooling coil is not required. Thus, a size of the apparatus can be reduced. In addition, since the complicated and expensive cooling coil is not required, costs of manufacturing and repairing the apparatus can be reduced and repair work can be performed rapidly.

According to the nineteenth aspect of the present invention, the drying apparatus is provided with the cap for freely covering the opening of the processing vessel. Therefore, when the object to be processed is not put in, the opening is blocked by the cap so that the vapor in the processing vessel can be prevented from diffusing even if the nonreactive gas is not spouted from the spouting means. Consequently, an amount of the nonreactive gas to be used can be reduced.

According to the twentieth aspect of the present invention, a drying processing is performed for the substrate such as a semiconductor wafer by using the drying apparatus according to any of the first to nineteenth aspects of the present invention. Consequently, the substrate is exposed to a sufficient amount of the vapor of the solvent filled in the processing vessel at the drying step. As a result, the defective dryness of the surface of the substrate can be prevented. Thus, good results of the processing can be obtained.

Thus, it is an object of the present invention to provide a drying technique capable of preventing defective dryness.

These and other objects, features, aspects and advantages of the present invention will become more apparent from the following detailed description of the present invention when taken in conjunction with the accompanying drawings.

<1. Introduction>

First of all, a drying apparatus 100 which can act as one of basic techniques according to the following preferred embodiments as well as the drying apparatus 151 according to the prior art will be described below. While the following preferred embodiments will mainly describe examples in which the drying apparatus 100 forms a basis, they can also be executed on the basis of the drying apparatus 151 according to the prior art.

Figure 2:
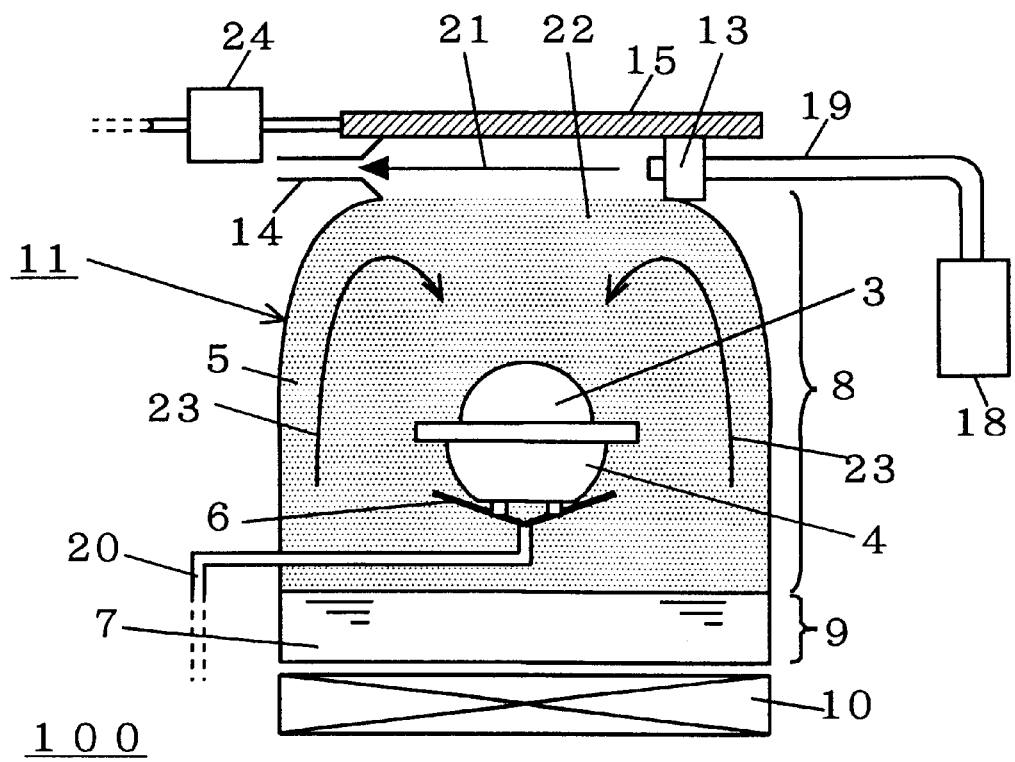
FIG. 2 is a front sectional view showing an apparatus which forms a basis of each embodiment.

FIG. 2 is a front sectional view showing a structure of a drying apparatus 100. The drying apparatus 100 is formed to dry a semiconductor wafer 3 in the same manner as the drying apparatus 151 according to the prior art. As shown in FIG. 2, the drying apparatus 100 comprises a processing vessel 11. The processing vessel 11 is formed as a container having an upper portion opened. In other words, an upward opening 22 is defined in the upper portion of the processing vessel 11. A side wall of the processing vessel 11 is smoothly curved inward in the vicinity of an upper end of the processing vessel 11 as the opening 22 is approached upward.

Nozzles (spouting means) 13 arranged in a line and a duct-shaped exhaust member (exhaust means) 14 are provided opposite to each other in the upper portion of the processing vessel 11 with the opening 22 interposed therebetween. One of ends of a pipe 19 is connected to each nozzle 13. The other end of the pipe 19 is connected to a nitrogen gas feeder 18. For example, the nitrogen gas feeder 18 is provided as one of plants. An exhaust port defined on the exhaust member 14 is opened opposite to the nozzles 13.

Furthermore, a cap 15 for freely covering the opening 22 is provided above the processing vessel 11. In order for the cap 15 to be freely (i.e. removably) put on or taken off, an actuator 24 is coupled to the cap 15 as shown in FIG. 2, for example. The actuator 24 causes the cap 15 to move horizontally in response to a signal sent from a controller (not shown) and to be put on or taken off.

A heater (first heater) 10 is provided just below a bottom portion of the processing vessel 11. Furthermore, a pan 6 is fixed in a position between the bottom portion and the upper opening 22 in the processing vessel 11. One of ends of a pipe 20 for drain is connected to a bottom portion of the pan 6. The pipe 20 penetrates the side wall of the processing vessel 11 and leads to an outside.

The drying apparatus 100 is used in the following procedure. First of all, a solvent suitable for drying the rinsed semiconductor wafer 3, for example, an IPA (solvent) 7 is fed into the processing vessel 11. An amount of the IPA 7 to be fed is regulated such that a liquid level is positioned below the bottom portion of the pan 6. The heater 10 is turned on with the cap 15 put on.

As a result, heat generated by the heater 10 is transferred to the IPA 7 through the bottom portion of the processing vessel 11. The IPA 7 is heated so that it is vaporized. Consequently, an IPA vapor 5 is generated. The IPA vapor 5 is filled into the processing vessel 11. More specifically, the processing vessel 11 is divided into a liquid storing section 9 for storing the IPA 7 and a vapor filling section 8 is provided over the liquid storing section 9 for filling the IPA vapor 5.

Before the rinsed semiconductor wafer 3 is put into the processing vessel 11, a nitrogen gas is fed from the nitrogen gas feeder 18 to the nozzles 13 through the pipes 19. Consequently, the nitrogen gas is spouted from the nozzles 13. Since the nozzles 13 are arranged in a line, the spouted nitrogen gas, that is, a jet 21 of the nitrogen gas becomes film-shaped to cover the whole opening 22. The jet 21 is collected by the exhaust port of the exhaust member 14 opened opposite to the nozzles 13. The exhaust member 14 discharges, to the outside, the jet 21 sucked through the exhaust port.

Figure 22:
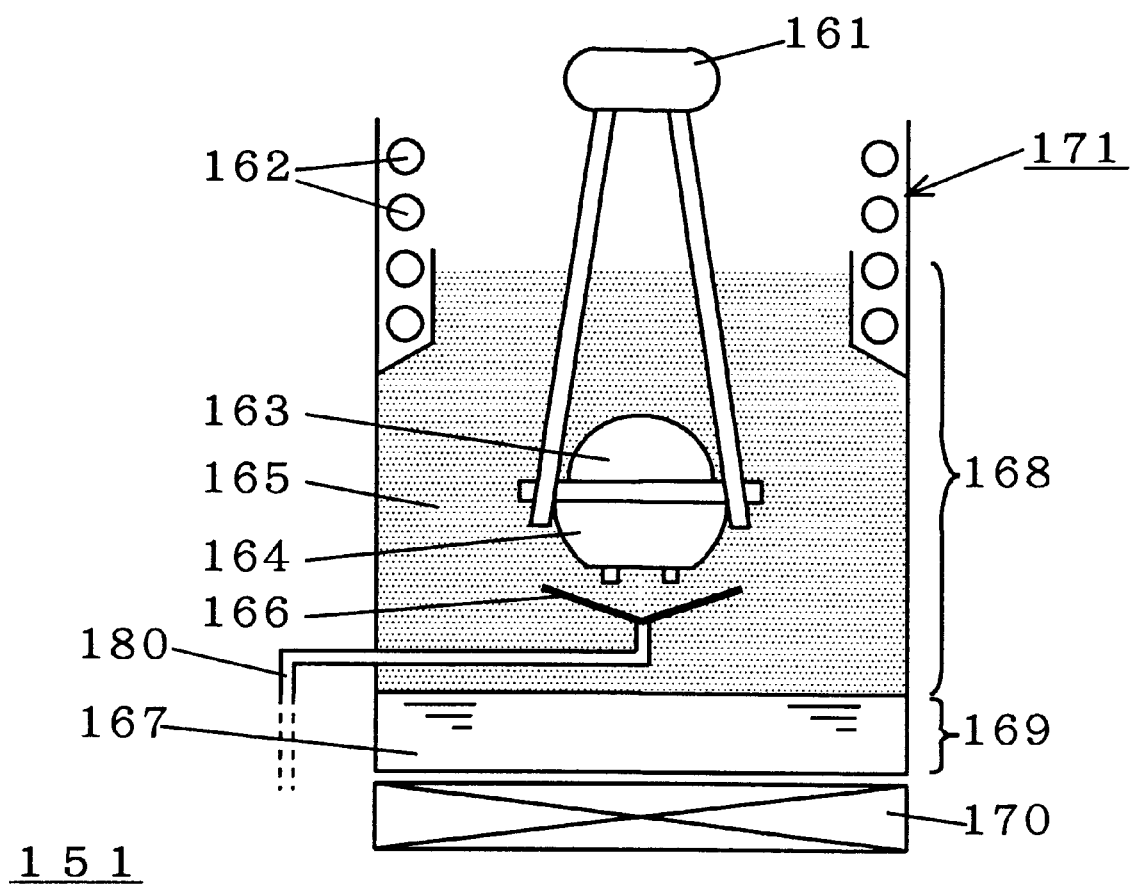
FIG. 22 is a front sectional view showing an apparatus according to the prior art.

While the jet 21 is being spouted, the cap 15 is taken off so that the semiconductor wafer 3 which acts as an object to be processed is put into the processing vessel 11. After a rinsing processing is completed, a plurality of semiconductor wafers 3 and a cassette 4 carrying them are suspended from the same holding arm as the holding arm 161 (FIG. 22) and are inserted from above the opening 22 into the vapor filling section 8 through the opening 22 across the jet 21. The cassette 4 carrying the semiconductor wafers 3 is mounted on the pan 6 as shown in FIG. 2. Then, the holding arm is pulled up to the outside. After the holding arm is removed toward the outside, the cap 15 can be put on and the jet 21 can be stopped.

The semiconductor wafers 3 and the cassette 4 are held in the vapor filling section 8. Therefore, the IPA vapor 5 filled into the vapor filling section 8 condenses and dissolves into waterdrops which stick to surfaces of the semiconductor wafers 3 and the cassette 4. Since IPA has a high solubility to water, a large amount of the IPA is soluble in the waterdrops. As a result, the waterdrops are essentially changed to IPA droplets so that weights are increased. The IPA droplets slip from the surfaces of the semiconductor wafers 3 and the cassette 4 because of their weights.

Thus, the semiconductor wafers 3 and the cassette 4 which are wet with the waterdrops can be dried. The slipping IPA droplets are collected by the pan 6 and are then discharged to the outside through the pipe 20. More specifically, the IPA having waterdrops and a small amount of impurities is not mixed with the IPA 7 but discharged to the outside of the processing vessel 11. Consequently, the purity of the IPA 7 stored in the liquid storing section 9 is kept high.

When drying processing of the semiconductor wafers 3 and the cassette 4 is completed, the jet 21 is generated again so that the cap 15 is taken off. Then, the holding arm is inserted into the processing vessel 11 again and the cassette 4 carrying the semiconductor wafers 3 is pulled up by the holding arm and is taken out of the processing vessel 11 through the opening 22 across the jet 21. Thereafter, the semiconductor wafers 3 and the cassette 4 thus taken out are delivered to a next processing step. Subsequently, new (i.e. unprocessed) semiconductor wafers 3 and a new cassette 4 are put into the vapor filling section 8 of the processing vessel 11. Thus, the drying processing of the semiconductor wafers 3 and the cassette 4 is performed repeatedly.

When the drying processing of the semiconductor wafers 3 and the cassette 4 is performed, they may not be mounted on the pan 6 but held above the pan 6 in the vapor filling section 8 by the holding arm. In this case, the cap 15 is taken off and the jet 21 is not stopped while the drying processing is being performed.

When the semiconductor wafers 3 and cassette 4 to be processed are put into the processing vessel 11 and are taken out of the processing vessel 11 and when the drying processing is being performed depending on circumstances, the cap 15 is taken off and the jet 21 is generated at the same time. Although the cap 15 is taken off, the IPA vapor 5 is obstructed by the jet 21 covering the opening 22. Therefore, it is hard for the IPA vapor 5 to diffuse to the outside of the processing vessel 11 through the opening 22. In other words, most of the IPA vapor 5 stays in the vapor filling section 8. More specifically, the jet 21 functions as a kind of curtain for preventing passage of a gas.

In the drying apparatus 100, a shape of the processing vessel 11 plays an important part such that the jet 21 effectively functions as the curtain. As shown in FIG. 2, the IPA vapor 5 generated from the IPA 7 goes up along the side wall of the processing vessel 11. As described above, however, the side wall of the processing vessel 11 is smoothly curved inward in the vicinity of the opening 22 as the opening 22 is approached.

For this reason, the flow of the IPA vapor 5 is smoothly curved inward along a curved portion of the side wall in the vicinity of the upper portion of the processing vessel 11. The IPA vapor 5 is cooled in the upper portion of the vapor filling section 8 so that the flow of the IPA vapor 5 is linked to a downward flow. In other words, a convection of the IPA vapor 5 is generated in the vapor filling section 8 along a flow 23 shown in FIG. 2. As a result, the jet 21 can effectively prevent the IPA vapor 5 filled in the vapor filling section 8 from flowing to the outside through the opening 22.

In the drying apparatus 100, the jet 21 is generated. Therefore, it is not necessary to use the cooling coil 162 which should be used in the drying apparatus 151 according to the prior art. Consequently, it is possible to eliminate instability of a state of the IPA vapor 165 caused with a change in a state of a refrigerant fed to the cooling coil 162. In other words, a concentration of the IPA vapor 5 filled in the vapor filling section 8, an expansion thereof and the like are stabilized. As a result, objects to be processed such as the semiconductor wafers 3 and the cassette 4 are easily dried uniformly and stably. More specifically, problems of defective dryness in the drying apparatus 151 according to the prior art can be eased, and yield of a semiconductor device manufactured in the semiconductor wafer 3 can be enhanced.

Since the cap 15 which can freely be put on or taken off is provided, the opening 22 can be blocked by the cap 15 when the drying apparatus 100 does not operate, when operation is being prepared or when the semiconductor wafers 3 and the cassette 4 are not put into the processing vessel 11 during the operation. For a period in which the cap 15 is put on, it is not necessary to feed the nitrogen gas to the nozzles 13. Therefore, the amount of the nitrogen gas to be used can be reduced. In addition to the nozzles 13 and the exhaust member 14, the cap 15 also functions as diffusion preventing means for preventing the IPA vapor 5 from diffusing to the outside through the opening 22.

In large scale mass production plants, the cost of the nitrogen gas to be used cannot be neglected. Accordingly, it is impossible to disregard the effect that the cost can be reduced by existence of the cap 15. Furthermore, the period in which the nozzles 13 operate is shortened. Consequently, wear of the nozzles 13 can be reduced so that a life of the apparatus can be prolonged.

While an example in which the IPA is used as a solvent to be stored in the processing vessel 11 has been described, other solvents suitable for drying the rinsed objects to be processed may be used. In general, it is possible to use an organic solvent having a lower boiling point than that of water, lower latent heat of vaporization than that of the water and a high solubility to the water. For example, TFEA (trifluoroethyl alcohol), HFIPA (hexafluoroisopropyl alcohol), PFPA (pentafluoropropyl alcohol) and the like are suitable.

While an example in which the nitrogen gas is used as a gas to be fed to the nozzles 13 through the pipes 19 has been described, other kinds of gases such as chemically stable gases, that is, nonreactive gases may generally be used. For example, an inert gas such as an argon gas may be used. The nitrogen gas is the most inexpensive of all nonreactive gases, and is easily available.

While an example in which the nozzles 13 are arranged in a line so that the jet 21 for covering the opening 22 like a film is generated has been described, a single nozzle capable of generating the film-shaped jet 21 may be provided in place of the nozzles 13 arranged in a line.

Figure 1:
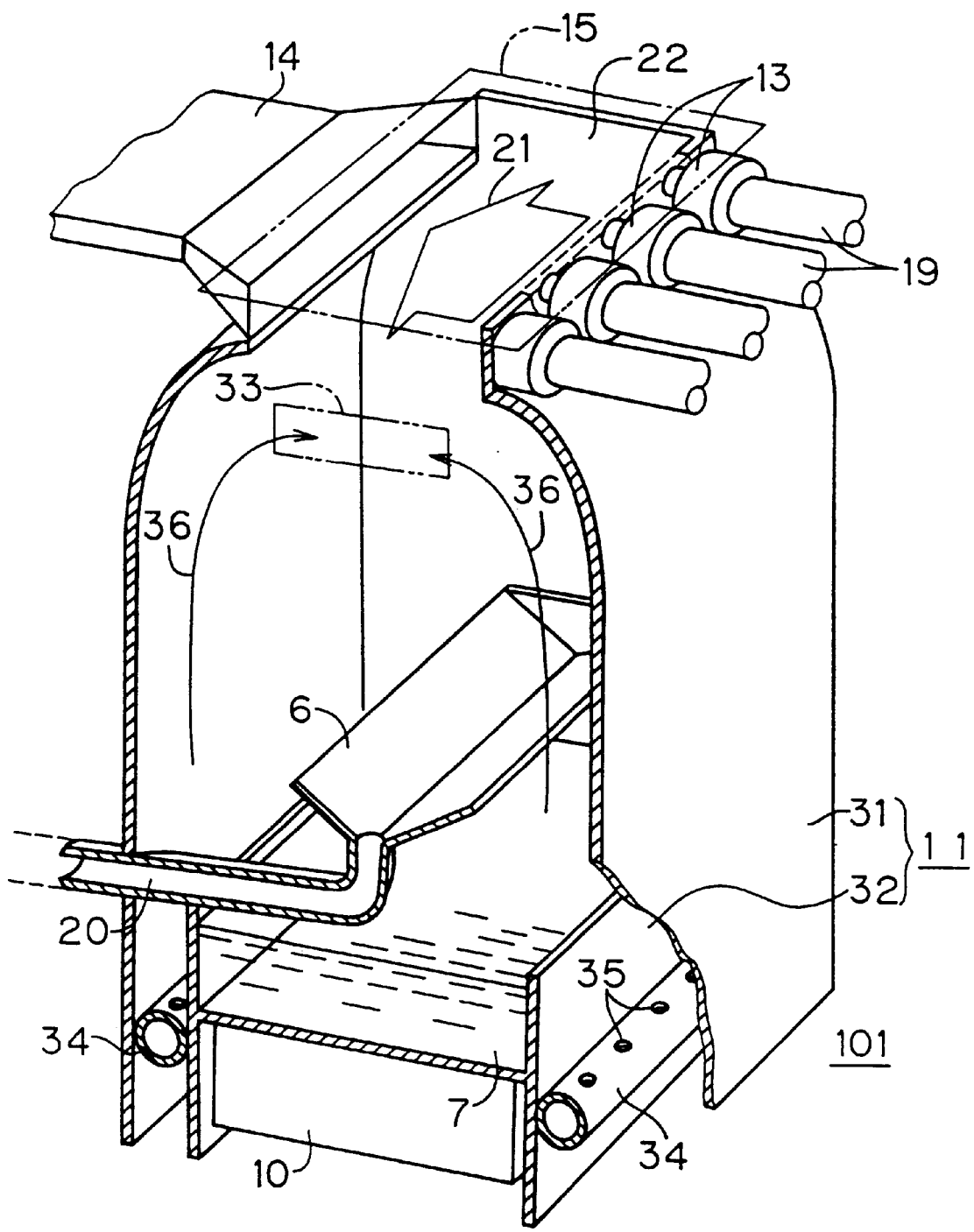
FIG. 1 is a perspective sectional view showing an apparatus according to a first embodiment.
Figure 3:
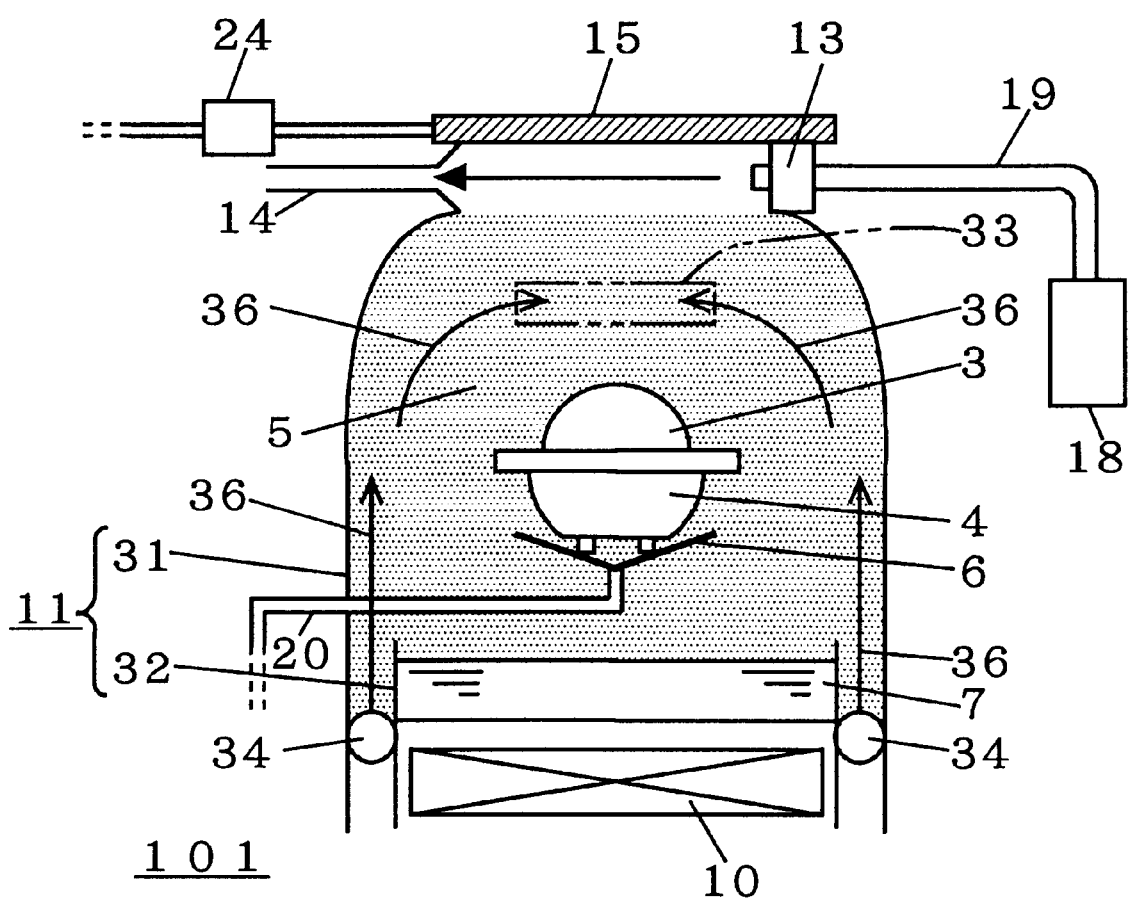
FIG. 3 is a front sectional view showing the apparatus according to the first embodiment.
Figure 4:
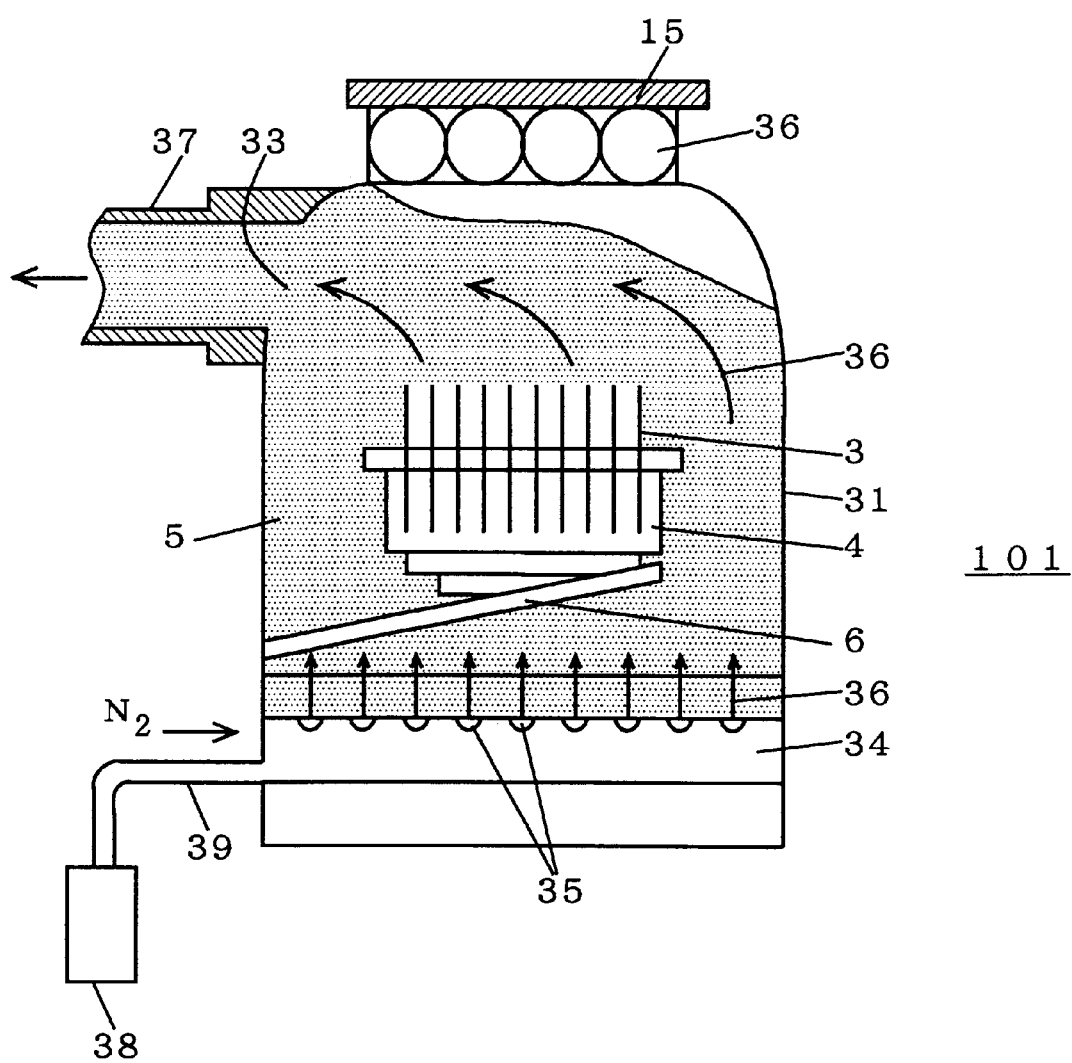
FIG. 4 is a side sectional view showing the apparatus according to the first embodiment.

FIGS. 1, 3 and 4 are perspective, front and side sectional views showing the structure of a drying apparatus according to a first embodiment, respectively. A drying apparatus 101 is characteristically different from the drying apparatus 100 in that a flow of a nitrogen gas is generated so as to cover an inner surface of a side wall of a processing vessel 11, that is, an internal wall of a vapor filling section. By this characteristic of the drying apparatus 101, the problem of a drop in the concentration of an IPA vapor 5 can be eased, and defective dryness of objects to be processed can further be prevented.

In the drying apparatus 101, the processing vessel 11 includes a vapor filling section 31 forming the side wall of the processing vessel 11 and filling the IPA vapor 5, and a liquid storing section 32 provided in a bottom portion of the processing vessel 11 for storing an IPA 7. A nozzle 34 is provided under the vapor filling section 31 adjacently thereto. The nozzle 34 tightly comes in contact with a wall of the vapor filling section 31 and that of the liquid storing section 32 therebetween.

More specifically, a gap provided between the vapor filling section 31 and the liquid storing section 32 is blocked by the nozzle 34 such that an inside of the processing vessel 11 does not communicate with an outside thereof through the gap. For example, the nozzle 34 is pipe-shaped with one of ends blocked, and is horizontally provided. A line of jet holes 35 are formed on a top of the nozzle 34. The other end of the nozzle 34 is connected to a nitrogen gas feeder 38 through a pipe 39.

Another opening, that is, a suction port 33 is formed in an upper portion of the vapor filling section 31 forming the side wall of the processing vessel 11 below a jet 21. The suction port 33 is connected through a pipe 37 to an exhauster (not shown) provided on an outside.

In the same manner as in the drying apparatus 100, a heater 10 for heating the IPA 7 is provided just below the liquid storing section 32. Similarly, a pan 6 is provided in the vapor filling section 31, and nozzles 13, an exhaust member 14 and a cap 15 are provided on a top of the processing vessel 11.

In the drying apparatus 101, when the heater 10 is driven so that the IPA 7 is heated, the nitrogen gas is fed from the nitrogen gas feeder 38 to the nozzle 34. The fed nitrogen gas is spouted upward from the jet holes 35 arranged in a line. An inside of the processing vessel 11 is sucked by the exhauster (not shown) through the suction port 33 and the pipe 37.

For this reason, a jet 36 of the nitrogen gas becomes film-shaped and flows from the nozzle 34 toward the suction port 33 alone an internal wall of the vapor filling section 31. More specifically, the jet 36 flows from a lower portion of the internal wall of the vapor filling section 31 to an upper portion thereof so as to cover the internal wall. The jet 36 which has reached the suction port 33 is discharged to the exhauster through the pipe 37.

Thus, the internal wall of the vapor filling section 31 is covered with the jet 36 of the nitrogen gas. Therefore, the IPA vapor 5 can be prevented from condensing uselessly on the internal wall of the vapor filling section 31. Consequently, the IPA vapor 5 is effectively utilized for condensation on a surface of an object to be processed such as a semiconductor wafer 3. Accordingly, defective dryness of the object to be processed can further be prevented. As a result, yield of a semiconductor device manufactured in the semiconductor wafer 3 can be enhanced still more.

In particular, the nozzle 34 is positioned under the vapor filling section 31 and the suction port 33 is positioned in the upper portion of the vapor filling section 31. Therefore, the jet 36 generated by the nozzle 34 is smoothly collected by the suction port 33 after it goes up along the internal wall of the vapor filling section 31. Particularly, the wall of the vapor filling section 31 is smoothly curved inward in the upper portion. Consequently, the jet 36 is smoothly led to the suction port 33 by the curved wall. Therefore, turbulence of the flow of the IPA vapor 5 is caused with difficulty in the vapor filling section 31. Thus, the IPA vapor 5 easily condenses on the object to be processed such as the semiconductor wafer 3 stably and uniformly.

While FIG. 4 has shown an example in which the nitrogen gas feeder 38 is provided separately from a nitrogen gas feeder 18, they may be shared by a single nitrogen gas feeder. For example, the drying apparatus 101 may have a structure in which the nitrogen gas feeder 18 feeds the nitrogen gas to the nozzles 13 and 34.

While an example in which the nitrogen gas is used as a gas to be fed to the nozzle 34 has been described, other kinds of gases such as chemically stable gases, that is, nonreactive gases may generally be used like the gas fed to the nozzles 13. For example, an inert gas such as an argon gas may be used. As described above, the nitrogen gas is the most desirable in that it is the most inexpensive of the nonreactive gases, and is easily available.

Figure 5:
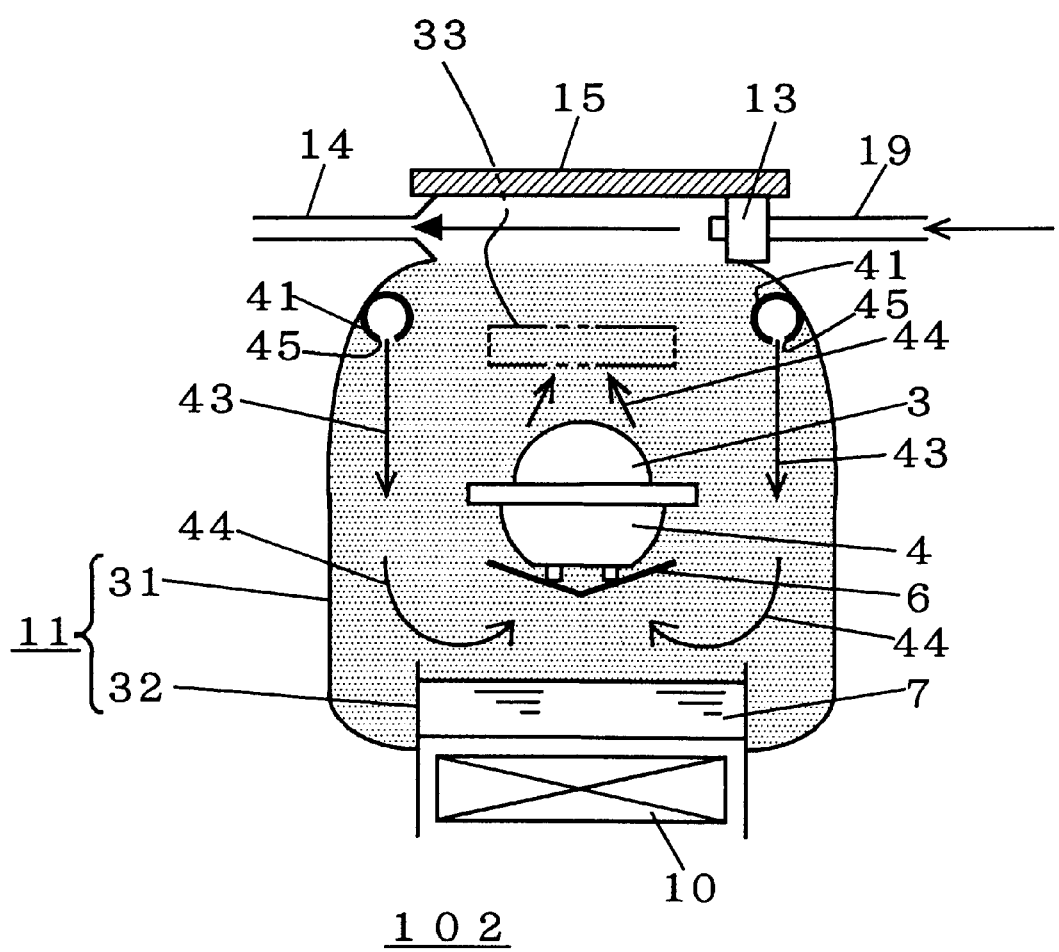
FIG. 5 is a front sectional view showing an apparatus according to a second embodiment.

FIG. 5 is a front sectional view showing a structure of a drying apparatus according to a second embodiment. A drying apparatus 102 is characteristically different from the drying apparatus 101 in that a nozzle 41 is provided in an upper portion of a vapor filling section 31. More specifically, the nozzle 41 having the same structure as that of the nozzle 34 (FIG. 1) is horizontally provided in an upper position of the vapor filling section 31 adjacently to an internal wall. A plurality of jet holes 45 formed in a line on the nozzle 41 are turned downward. For example, the nozzle 41 is connected to the nitrogen gas feeder 38 (FIG. 4) in the same manner as the nozzle 34.

Also in the drying apparatus 102, when a heater 10 is driven so that an IPA 7 is heated in the same manner as in the drying apparatus 101, a nitrogen gas is fed from the nitrogen gas feeder 38 to the nozzle 41, for example. The fed nitrogen gas is spouted downward from the jet holes 45 arranged in a line. An inside of a processing vessel 11 is sucked by an exhauster (not shown) through a suction port 33.

For this reason, a jet 43 of the nitrogen gas becomes film-shaped and flows from an upper portion of an internal wall of the vapor filling section 31 to a lower portion thereof along the internal wall so as to cover the internal wall. The jet 43 which has reached the lower portion of the vapor filling section 31 changes to an inward direction and is then linked to a flow 44 which goes up from a space below the pan 6 to a space thereabove. The flow 44 passes through a cassette 4 and a semiconductor wafer 3, and is then collected by the suction port 33 positioned above the cassette 4 and the semiconductor wafer 3.

The internal wall of the vapor filling section 31 is covered with the jet 43. In the same manner as in the drying apparatus 101, therefore, an IPA vapor 5 can be prevented from condensing uselessly on the internal wall of the vapor filling section 31 Consequently, the IPA vapor 5 is effectively utilized for condensation, on a surface of an object to be processed such as the semiconductor wafer 3.

Furthermore, the IPA vapor 5 generated from the IPA 7 is forcedly fed to the semiconductor wafer 3 and the cassette 4 by the flow 44 of the nitrogen gas as well as a natural convection. Consequently, the efficiency of the IPA vapor 5 condensing on the object to be processed is further increased. In other words, the IPA vapor 5 is utilized for drying surfaces of the semiconductor wafer 3 and the cassette 4 more effectively.

Accordingly, defective dryness of the object to be processed can be prevented more than in the drying apparatus 101. Consequently, the yield of a semiconductor device manufactured in the semiconductor wafer 3 can be enhanced still more. Since the drying apparatus 102 can increase uniformity of dryness of the surface of the object to be processed, it is particularly suitable for a processing of drying the semiconductor wafer 3 having a great diameter and a large surface area. The drying apparatus 102 is similar to the drying apparatus 101 in that not only the nitrogen gas but also nonreactive gases can generally be used.

Figure 6:
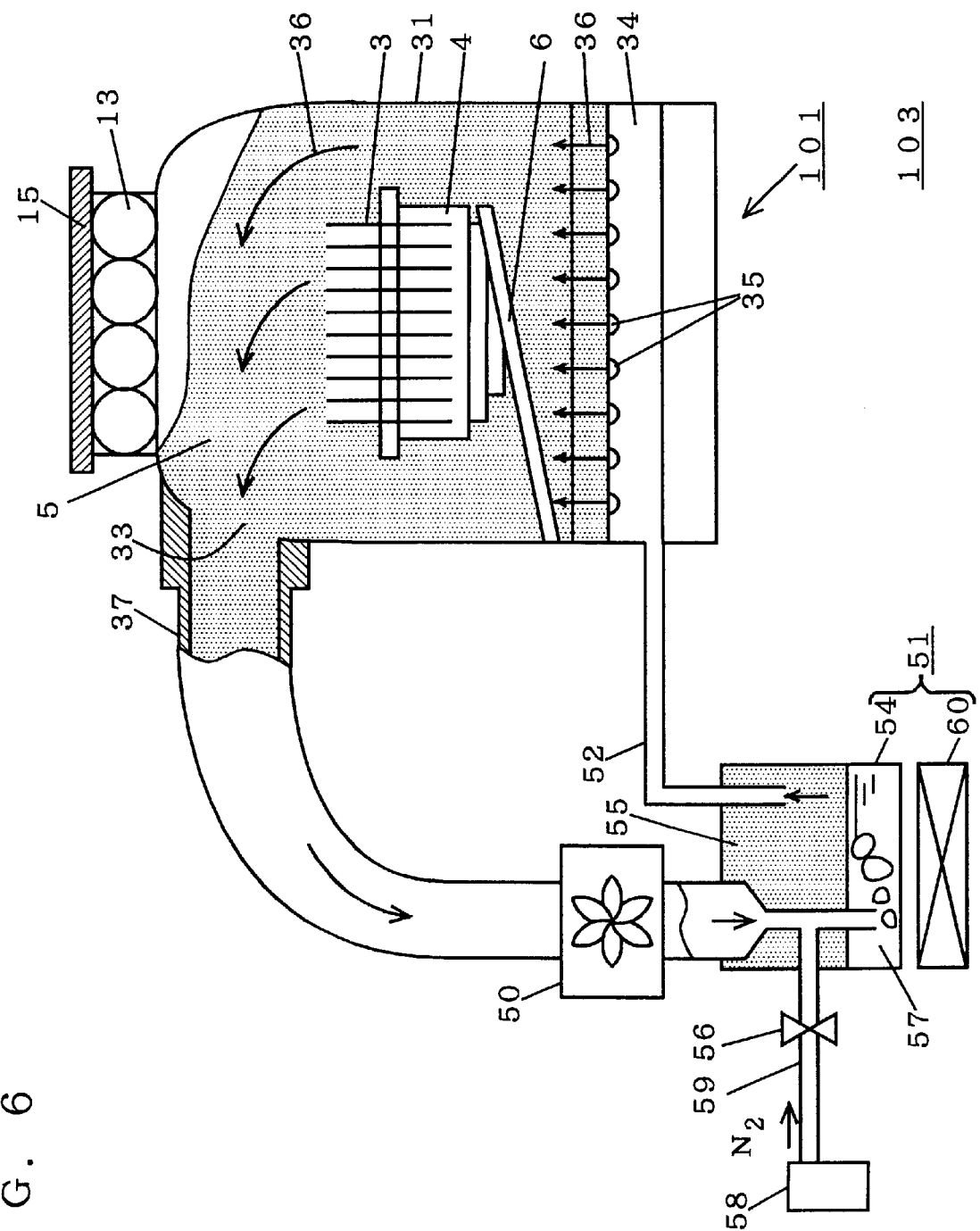
FIG. 6 is a side sectional view showing an apparatus according to a third embodiment.

FIG. 6 is a side sectional view showing a structure of a drying apparatus according to a third embodiment. A drying apparatus 103 is characteristically different from the drying apparatus 101 in that a nitrogen gas is cyclically fed to a nozzle 34 and is mixed with an IPA vapor. More specifically, the drying apparatus 103 comprises a mixed gas generating unit 51 connected to the suction port 33 of the drying apparatus 101 through the pipe 37.

The mixed gas generating unit (mixed gas generating means) 51 includes a container-shaped mixing vessel 54, and a heater (third heater) 60 provided just below a bottom portion of the mixing vessel 54. An end of the pipe 37 leads into the mixing vessel 54. Furthermore, another pipe 52 is coupled to the mixing vessel 54. The mixing vessel 54 is connected to the nozzle 34 through the pipe 52.

In the mixing vessel 54, the pipe 37 is opened lower than the pipe 52. When using the drying apparatus 103, an IPA 57 is stored in the mixing vessel 54 such that a liquid level is positioned above an open end of the pipe 37 and below an open end of the pipe 52. A fan (sucking means) 50 is inserted in the middle of the pipe 37. A nitrogen gas feeder 58 is connected to the pipe 37 through another pipe 59. Furthermore, a valve 56 is inserted in the middle of the pipe 59.

Since the drying apparatus 103 has the above-mentioned structure, it operates in the following manner. More specifically, the inside of a processing vessel 11 is sucked by the fan 50 through the suction port 33 and the pipe 37. The sucked gas contains the IPA vapor in addition to the nitrogen gas. The mixed gas is led to the IPA 57 stored in the mixing vessel 54.

When using the drying apparatus 103, the IPA 57 is heated by the heater 60. For this reason, the mixing vessel 54 is filled with the IPA vapor in a space formed above the IPA 57. The mixed gas led through the pipe 37 is mixed with the IPA vapor to increase a concentration of the IPA vapor, and is fed to the nozzle 34 through the pipe 52 again.

Thus, the mixed gas having a high concentration of the IPA vapor is fed to the nozzle 34. Consequently, the concentration of the IPA vapor 5 in the processing vessel 11 can be prevented from being lowered. Therefore, defective dryness of an object to be processed can further be reduced. In other words, yield of a semiconductor device manufactured in a semiconductor wafer 3 which acts as the object to be processed can be enhanced still more.

The nitrogen gas contained in the mixed gas which is fed to the nozzle 34 is not discharged away toward an outside but is cyclically reused. Accordingly, the amount of the nitrogen gas to be consumed can be cut down. Consequently, the cost of a drying processing can be reduced.

When putting in and taking out the object to be processed, a part of the nitrogen gas is sometimes caused to diffuse toward the outside through the opening 22 (FIG. 1). In order to compensate for a decrease in the concentration of the nitrogen gas corresponding to the diffusion, it is preferable that the valve 56 should properly be opened to supply the nitrogen gas from the nitrogen gas feeder 58 to the mixing vessel 54 through the pipe 59.

Figure 7:
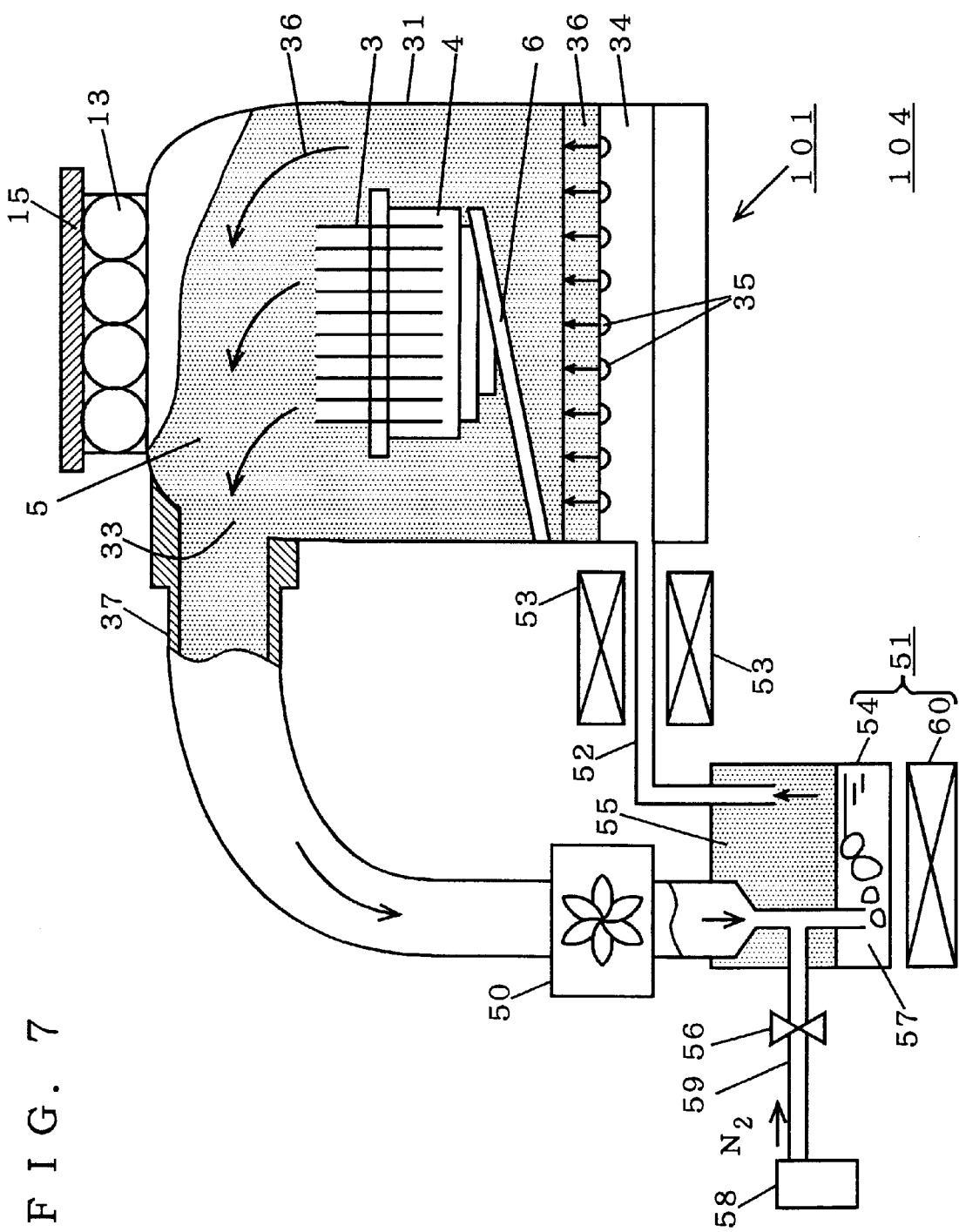
FIG. 7 is a side sectional view showing an apparatus according to a fourth embodiment.

FIG. 7 is a side sectional view showing the structure of a drying apparatus according to a fourth embodiment. A drying apparatus 104 is characteristically different from the drying apparatus 103 in that a heater (second heater) 53 is fixed to a pipe 52. A mixed gas passing through the pipe 52 is heated by the heater 53. Consequently, an IPA vapor contained in the mixed gas can be prevented from condensing on an internal wall of the pipe 52 in the process of delivering the mixed gas through the pipe 52. More specifically, the IPA vapor contained in the mixed gas which is generated by a mixed gas generating unit 51 is effectively fed to a nozzle 34 with a high concentration kept.

Therefore, the concentration of an IPA vapor 5 in a processing vessel 11 can further be prevented from being lowered. Consequently, defective dryness of an object to be processed can be reduced more. In other words, the yield of a semiconductor device manufactured in a semiconductor wafer 3 which acts as the object to be processed can be enhanced still more.

Figure 8:
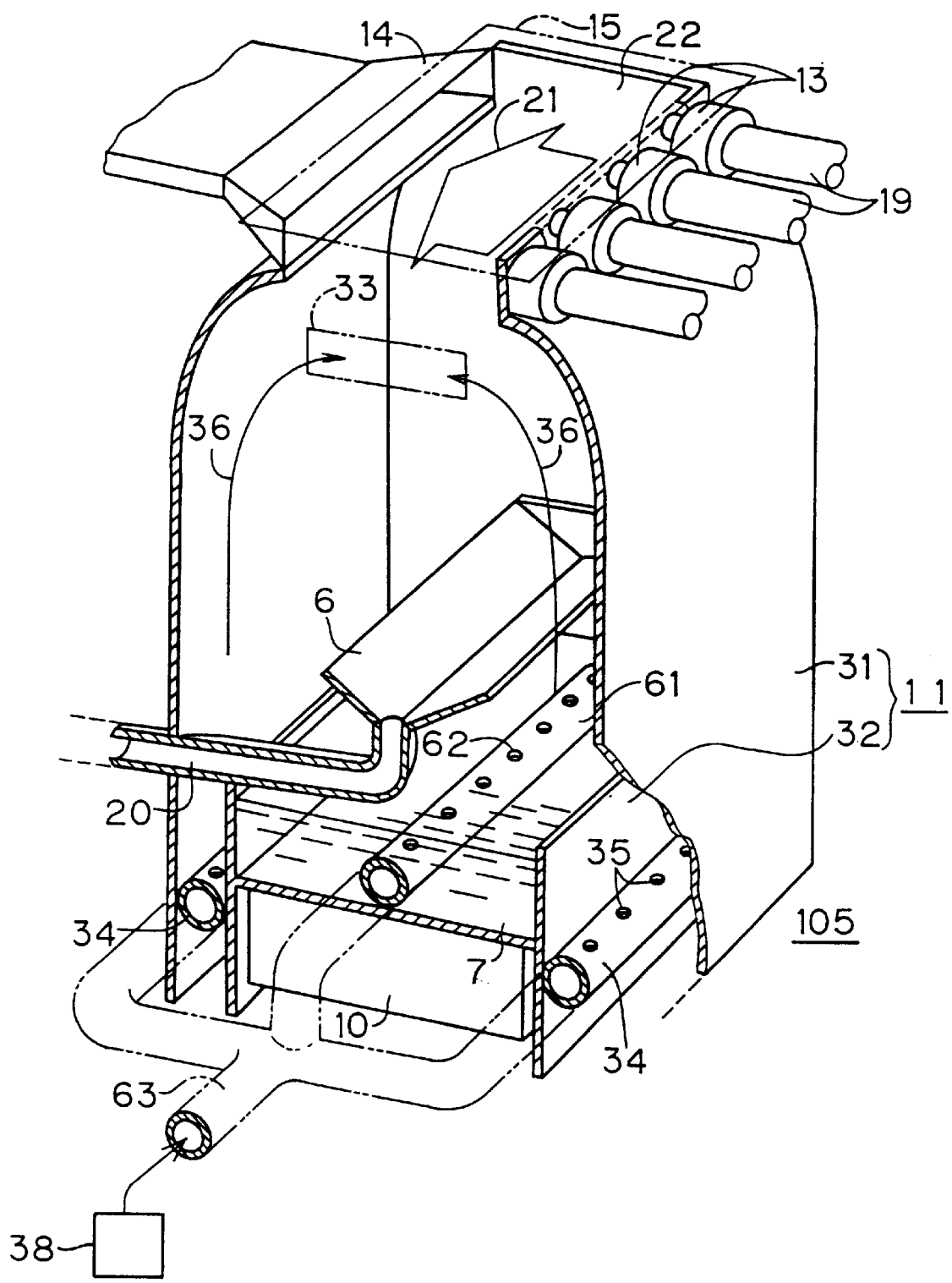
FIG. 8 is a perspective sectional view showing an apparatus according to a fifth embodiment.

FIG. 8 is a perspective sectional view showing a structure of a drying apparatus according to a fifth embodiment. A drying apparatus 105 is characteristically different from the drying apparatus 101 in that a nozzle 61 for bubbling is provided in a liquid storing section 32. For example, the nozzle 61 is pipe-shaped with one of ends blocked, and is horizontally provided. A line of jet holes 62 are formed on a top of the nozzle 61. The other end of the nozzle 61 is connected to a nitrogen gas feeder 38 through a pipe 63 together with a nozzle 34, for example.

Figure 9:
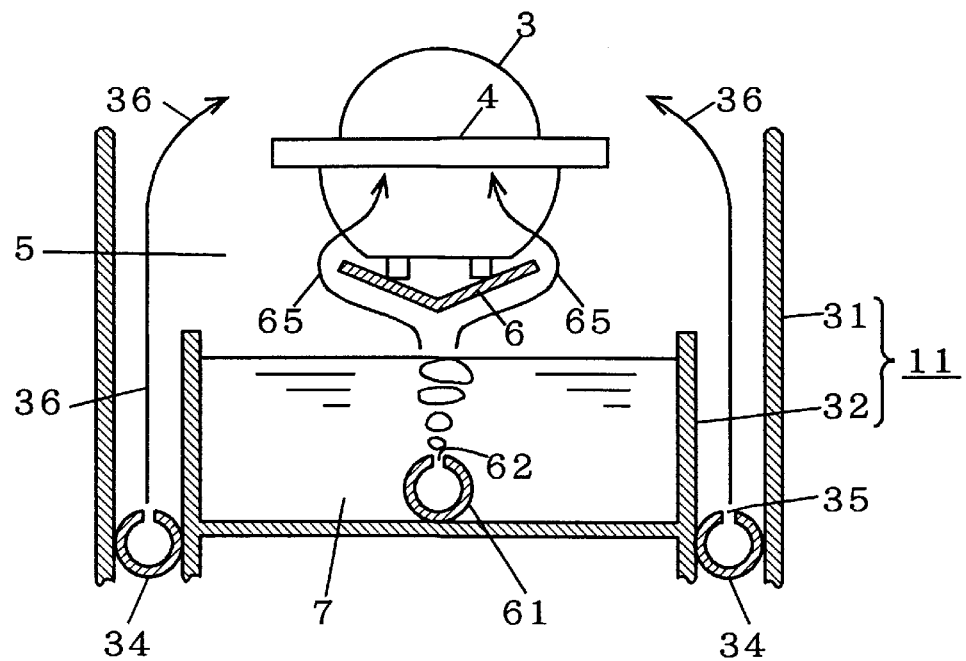
FIG. 9 is a partially enlarged sectional view showing the apparatus according to the fifth embodiment.

As shown in a partial front sectional view of FIG. 9, an IPA 7 is stored such that the jet holes 62 are sunk under a liquid level when using the drying apparatus 105. A nitrogen gas is fed to the nozzles 34 and 61 at the same time. As a result, the IPA 7 is bubbled by the nitrogen gas spouted from the jet holes 62 into the IPA 7.

Consequently, an IPA vapor 5 is generated from the IPA 7 more efficiently. Therefore, the concentration of the IPA vapor 5 is increased. As a result, the amount of the IPA vapor 5 condensing on an object to be processed such as a semiconductor wafer 3 is increased. Thus, defective dryness of the object to be processed can be reduced more. In other words, the yield of a semiconductor device manufactured in the semiconductor wafer 3 which acts as the object to be processed can be enhanced still more.

Since the nozzles 61 and 34 communicate with each other, a common gas can be fed to both nozzles at the same time. In other words, it is not necessary to separately provide a feeder for feeding the gas to the nozzles 34 and 61. Accordingly, the nozzle 61 can additionally be provided without a whole structure of the apparatus complicated.

It is desirable that the nozzle 61 should be provided under a pan 6, that is, under the semiconductor wafer 3 as shown in FIGS. 8 and 9. Consequently, the IPA vapor 5 generated acceleratingly by bubbling is changed to an upward vapor flow 65 toward the semiconductor wafer 3 and a cassette 4. Consequently, the amount of the IPA vapor 5 condensing on the objects to be processed is increased more. As a result, the defective dryness can be prevented more effectively.

As illustrated in a partial front sectional view of FIG. 10, the nozzle 61 is, preferably, further provided right and left in addition to the nozzle 61 provided just below the semiconductor wafer 3 so that generation of the IPA vapor 5 can further be accelerated. More specifically, a flow 66 of the IPA vapor 5 whose generation is promoted by the nozzles 61 provided right and left is added to the flow 65 of the IPA vapor 5 whose generation is promoted by the nozzle 61 provided just below the semiconductor wafer 3.

More specifically, a flow of the IPA vapor 5 is formed to be fed from below the semiconductor wafer 3 and from lower right and left sides toward the semiconductor wafer 3 and the cassette 4. As a result, the amount of the IPA vapor 5 condensing on the objects to be processed is increased still more. Consequently, defective dryness can further be prevented.

Figure 10:
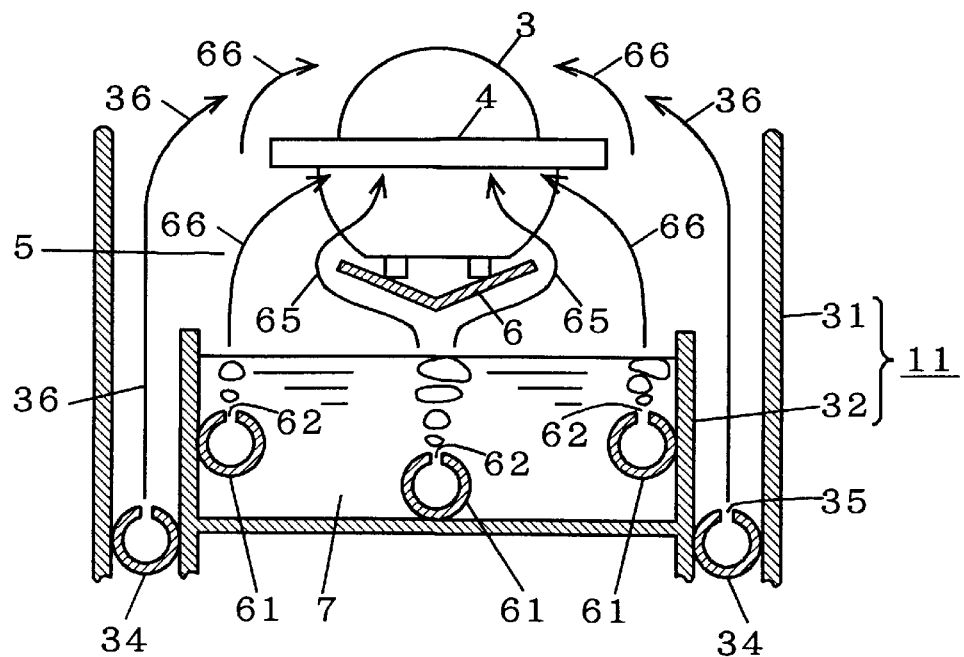
FIG. 10 is a partially enlarged sectional view showing another example of the apparatus according to the fifth embodiment.

While an example in which the nitrogen gas is fed to the nozzle 61 has been shown in FIGS. 8 to 10, nonreactive gases can generally be used in the same manner as the gas fed to the nozzle 34. Furthermore, a mixed gas of the IPA vapor and the nitrogen gas may be fed to the nozzle 61 by incorporating the nozzle 61 into the drying apparatus 103 and 104 in place of the drying apparatus 101. When the mixed gas which contains the IPA vapor having a high concentration is fed to the nozzle 61, a larger amount of the IPA vapor 5 can be fed to the semiconductor wafer 3 and the like.

Furthermore, the nozzle 61 can be incorporated into the drying apparatus 102. Thereby, the flow 44 (FIG. 5) is added as a flow fed toward the semiconductor wafer 3 and the like to the flows 65 and 66 of the IPA vapor. As a result, the amount of the IPA vapor 5 condensing on the semiconductor wafer 3 and the like is increased more.

Only the nozzle 61 can be provided without nozzles 34 and 41. In other words, the nozzle 61 can be incorporated into the drying apparatus 100 in place of the drying apparatus 101. Consequently, the amount of the IPA vapor condensing on the semiconductor wafer 3 and the like can correspondingly be increased by the flows 65 and 66 of the IPA vapor.

Figure 11:
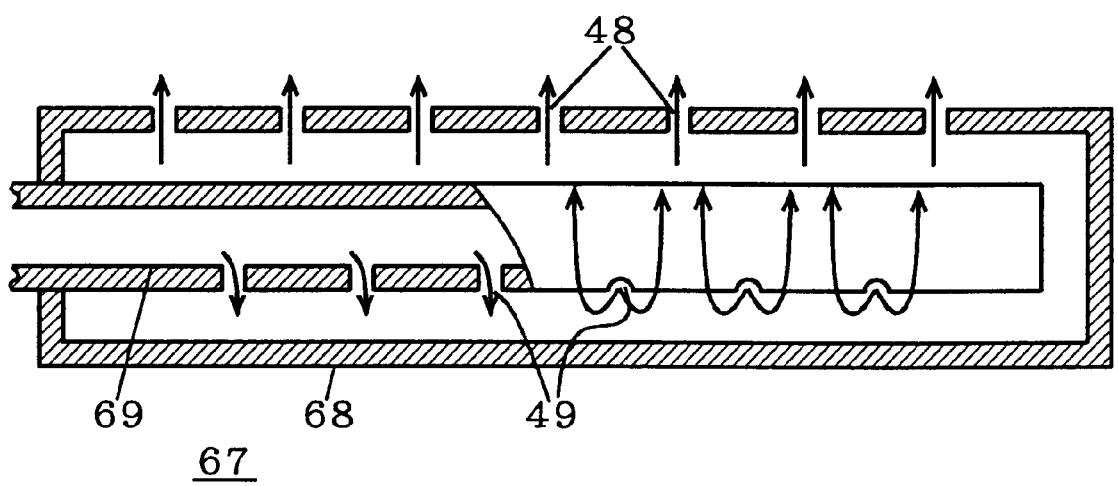
FIG. 11 is a sectional view showing a nozzle which acts as a part of an apparatus according to a sixth embodiment.

FIG. 11 is a sectional view showing a preferred example of a structure of a nozzle which acts as a part of a drying apparatus according to a sixth embodiment, that is, a nozzle used as the nozzles 34 and 41 for generating the jets 36 and 43 along the internal wall of the vapor filling section 31 provided in the drying apparatus 101, 102 and the like. A nozzle 67 has a double piping structure. More specifically, the nozzle 67 is provided with a cylindrical outer pipe 68 and a cylindrical inner pipe 69 inserted in the outer pipe 68. One of ends of the outer pipe 68 is blocked, and the other end thereof fixedly comes in contact with the inner pipe 69.

One of ends of the inner pipe 69 is also blocked. The other open end of the inner pipe 69 is coupled to the pipe 39 (FIG. 4) or the pipe 52 (FIGS. 6 and 7) and the pipe 63 (FIG. 8), which is not shown. A plurality of jet holes 48 are formed in a line on a side wall of the outer pipe 68. Similarly, a plurality of jet holes 49 are formed in a line on a side wall of the inner pipe 69. The relative positions of the jet holes 48 and 49 are set such that they are the most distant from each other, that is, they are symmetrical with respect to a central axis of the cylindrical pipe.

Since the nozzle 67 has such a structure, the force of a flow of a gas (for example, a nitrogen gas) fed to the inner pipe 69 through the pipe 39 and the like is reduced by the inner pipe 69 and then passes through the jet holes 49 toward the jet holes 48. For this reason, the gas is spouted at a comparatively uniform flow velocity from each of the jet holes 48 arranged in a line. In other words, a deviation of a flow rate of the gas spouted from the jet holes 48 can be relieved.

While an example in which the nozzle 34 and the like are formed as double pipes has been shown in FIG. 11, they can generally be formed to have a multi-piping structure having at least twice as many pipes. As a the multiplicity of pipes becomes higher, uniformity of the flow rate of the gas spouted from the jet holes 48 is increased.

Figure 12:
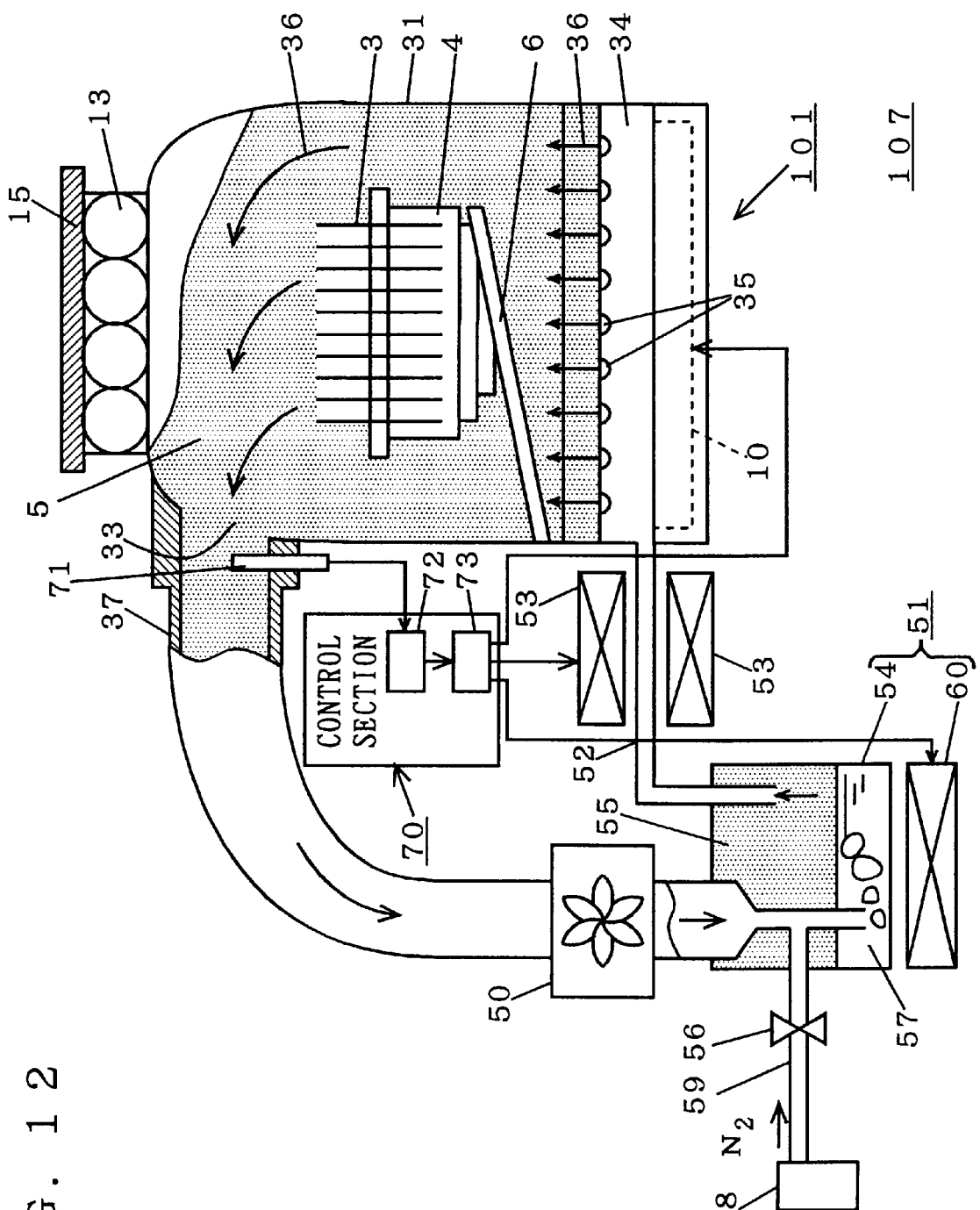
FIG. 12 is a side sectional view showing an apparatus according to a seventh embodiment.

FIG. 12 is a side sectional view showing a structure of a drying apparatus according to a seventh embodiment. A drying apparatus 107 is characteristically different from the drying apparatus 104 (FIG. 7) in that it comprises an IPA concentration sensor 71, and a control section (control means) 70 for controlling outputs of three heaters 10, 60 and 53 on the basis of a concentration value of an IPA vapor detected by the IPA concentration sensor 71.

The IPA concentration sensor 71 is provided on a suction port 33 and serves to detect the concentration of an IPA vapor 5 contained in a gas passing through the suction port 33 and to send, as a detection signal, a signal corresponding to the detected concentration. A concentration signal converting section 72 receives the detection signal, and calculates signals corresponding to the outputs of the heaters 10, 60 and 53 necessary for correcting a drop in a concentration from a target value or an excess of the concentration over the target value. A heater driving section 73 receives the signals output from the concentration signal converting section 72, and drives the heaters 10, 60 and 53 so as to obtain output values corresponding to the same signals.

Since the control section 70 has the above-mentioned structure, the outputs of the heaters 10, 60 and 53 are increased if the concentration of the IPA vapor 5 is lower than the target value. As a result, the concentration of the IPA vapor 5 returns to the target value. Conversely, if the concentration of the IPA vapor 5 is higher than the target value, the outputs of the heaters 10, 60 and 53 are reduced. As a result, the concentration of the IPA vapor 5 returns to the target value. Thus, a deviation from the target value can be eliminated by operation of the IPA concentration sensor 71 and the control section 70 even if it is caused on the concentration of the IPA vapor 5.

Consequently, a change in the concentration of the IPA vapor 5 caused by putting in the semiconductor wafer 3 and the like can be reduced so that the concentration of the IPA vapor 5 is kept at an almost constant value corresponding to the target value. As a result, an amount of the IPA vapor 5 condensing on an object to be processed such as the semiconductor wafer 3 is held according to a target. Therefore, defective dryness can further be prevented.

Figure 13:
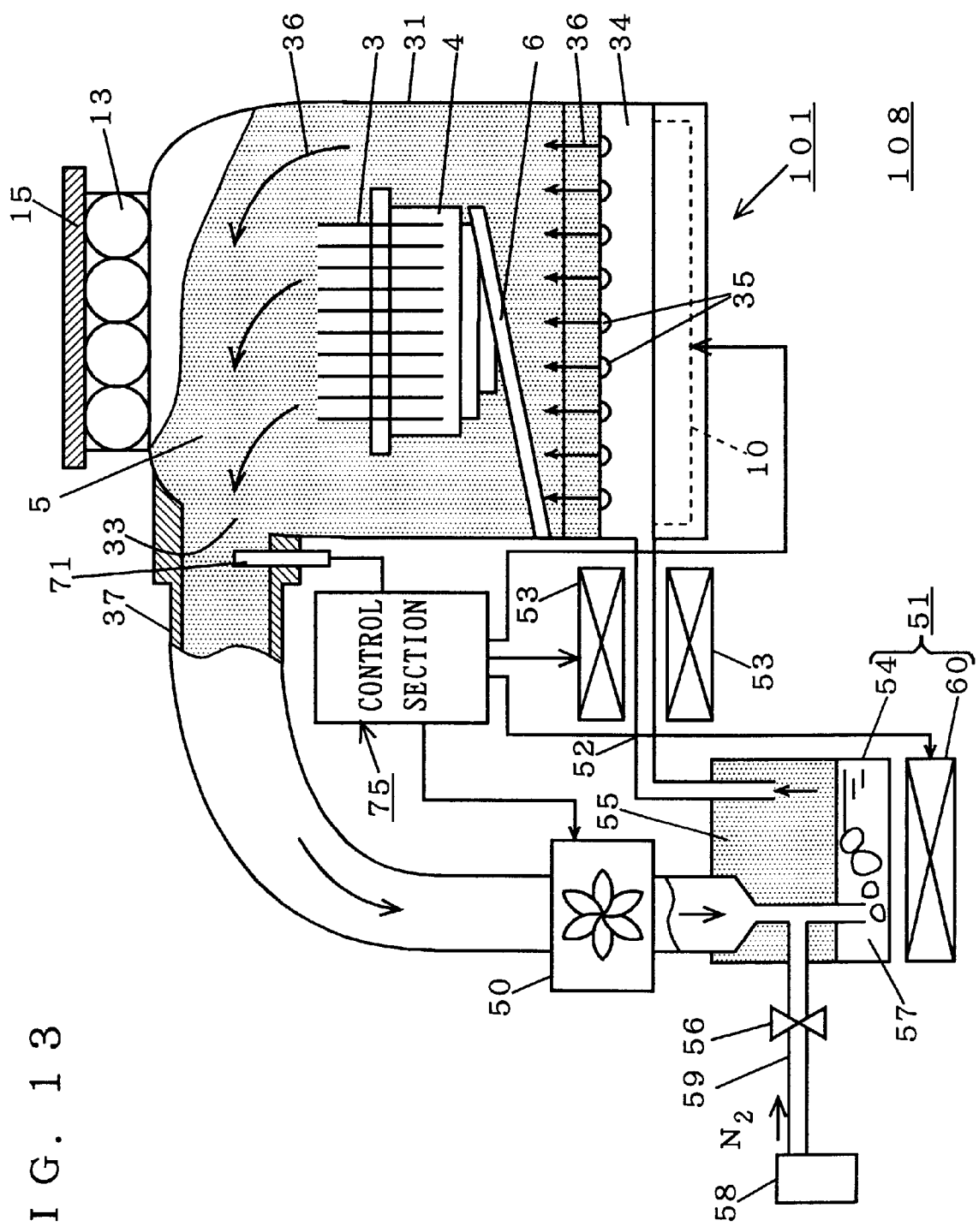
FIG. 13 is a side sectional view showing an apparatus according to an eighth embodiment.
Figure 14:
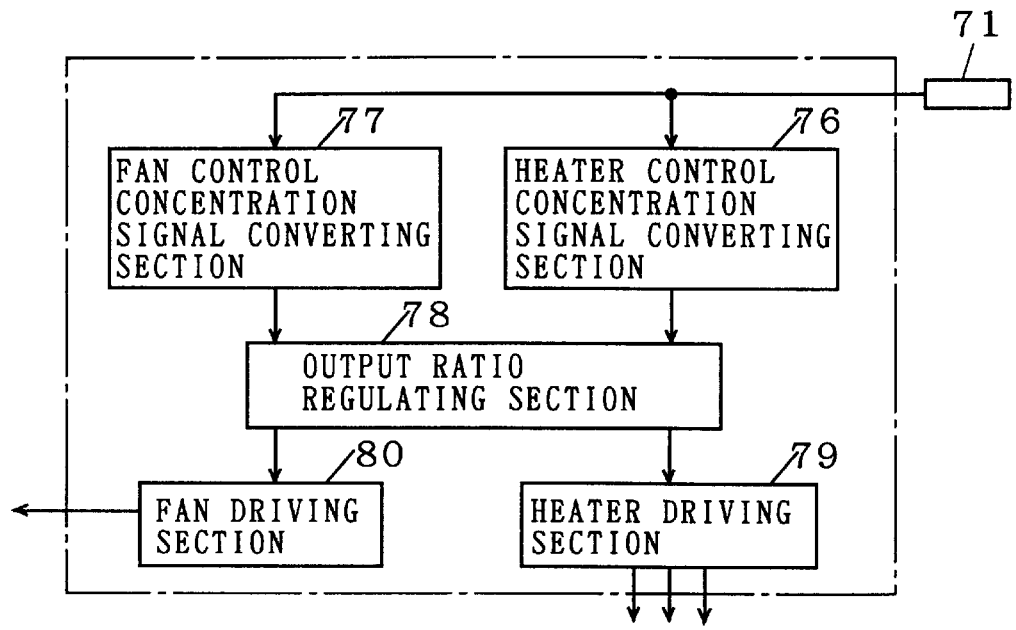
FIG. 14 is a block diagram showing a control section of the apparatus according to the eighth embodiment.

FIG. 13 is a side sectional view showing a structure of a drying apparatus according to an eighth embodiment. A drying apparatus 108 is characteristically different from the drying apparatus 107 in that a control section (control means) 75 is provided for controlling a fan 50 as well as heaters 10, 60 and 53. As shown in a block diagram of FIG. 14, the control section 75 includes a heater control concentration signal converting section 76, a fan control concentration signal converting section 77, an output ratio regulating section 78, a heater driving section 79 and a fan driving section 80.

The heater control concentration signal converting section 76 has the same structure as that of the concentration signal converting section 72 provided in the drying apparatus 107. More specifically, the heater control concentration signal converting section 76 calculates signals corresponding to outputs of the heaters 10, 60 and 53 which are necessary for correcting a drop in a concentration from a target value or an excess of the concentration over the target value in response to a detection signal of an IPA concentration sensor 71.

The signals are calculated on the assumption that only the heaters 10, 60 and 53 are controlled. More specifically, if the concentration detected by the IPA concentration sensor 71 is excessively higher or lower than a target value, signals are calculated so as to reduce or increase the outputs necessary for the heaters 10, 60 and 53, respectively.

The fan control concentration signal converting section 77 calculates a signal corresponding to an output of the fan 50 which is necessary for correcting a drop in a concentration from a target value or an excess of the concentration over the target value in response to the detection signal of the IPA concentration sensor 71. This signal is calculated on the assumption that only the fan 50 is controlled.

If the output of the fan 50 is higher, that is, a rotational speed is higher, collection of an IPA vapor 5 from an inside of a processing vessel 11 is promoted. For this reason, the fan control concentration signal converting section 77 calculates a signal so as to increase or reduce the output necessary for the fan 50 when the concentration detected by the IPA concentration sensor 71 is excessively higher or lower than the target value.

The output ratio regulating section 78 adds a weight to the output signal of the heater control concentration signal converting section 76 and that of the fan control concentration signal converting section 77, and outputs signals thus obtained to the heater driving section 79 and the fan driving section 80, respectively. In order to eliminate a deviation in the concentration from the target value, there is an optimal ratio between variations in the outputs of the heaters 10, 60 and 53 and the output of the fan 50. The output ratio regulating section 78 adds a weight corresponding to the optimal ratio to the signals output from the signal converting sections 76 and 77, and transmits signals thus obtained to the heater driving section 79 and the fan driving section 80, respectively.

The heater driving section 79 has the same structure as that of the heater driving section 73 provided in the drying apparatus 107. More specifically, the heater driving section 79 receives the signal output from the output ratio regulating section 78, and drives the heaters 10, 60 and 53 so as to obtain an output value corresponding to the same signal. Similarly, the fan driving section 80 receives the signal output from the output ratio regulating section 78, and drives the fan 50 so as to obtain an output value corresponding to the same signal.

The control section 75 has the above-mentioned structure. Therefore, if the concentration of the IPA vapor 5 is lower than the target value, the outputs of the heaters 10, 60 and 53 are increased and the output of the fan 50 is reduced at the same time. A ratio of variations in the outputs is optimized by the output ratio regulating section 78. As a result, the concentration of the IPA vapor 5 efficiently returns to the target value.

On the contrary, if the concentration of the IPA vapor 5 is higher than the target value, the outputs of the heaters 10, 60 and 53 are reduced and the output of the fan 50 is increased at the same time. A ratio of variations in the outputs is also optimized. As a result, the concentration of the IPA vapor 5 efficiently returns to the target value.

Thus, the deviation from the target value can rapidly be eliminated by operation of the IPA concentration sensor 71 and the control section 75 even if it is caused on the concentration of the IPA vapor 5. Consequently, it is possible to further reduce a fluctuation of the concentration of the IPA vapor 5 caused by putting in a semiconductor wafer 3 and the like. Consequently, the concentration of the IPA vapor 5 can be kept at an almost constant value corresponding to the target value. As a result, an amount of the IPA vapor 5 condensing on an object to be processed such as the semiconductor wafer 3 can be held according to a target. Therefore, defective dryness can further be prevented.

Figure 15:
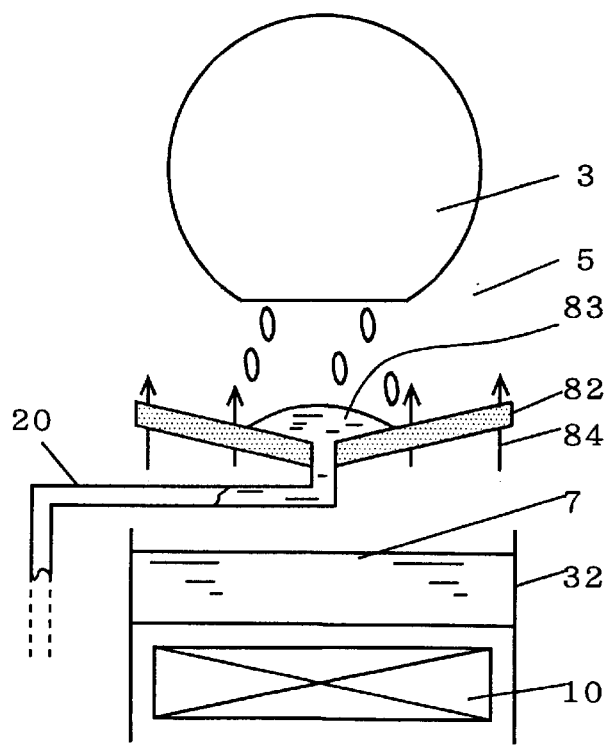
FIG. 15 is a partially enlarged sectional view showing an apparatus according to a ninth embodiment.

FIG. 15 is a front sectional view showing a preferred example of a structure of a pan which acts as a part of a drying apparatus according to a ninth embodiment, that is, a pan which can be used as the pans 6 and 166 of the drying apparatus 101 to 108 and 151. A pan 82 is formed of a material which is permeable to a gas and impermeable to a liquid. For example, "4 - methylene pentene - 1" is suitable for the material.

Figure 16:
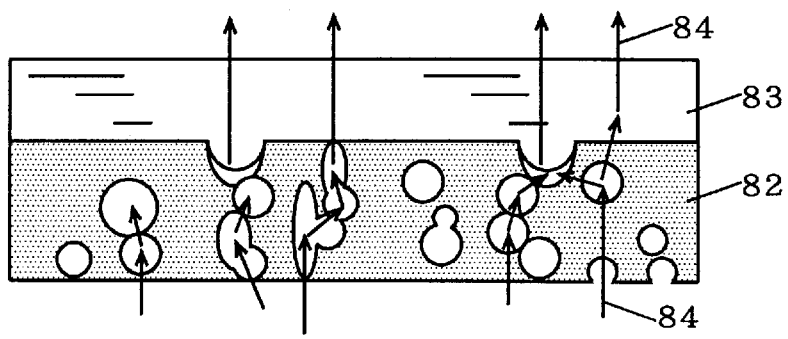
FIG. 16 is a partially enlarged sectional view showing a pan provided in the apparatus according to the ninth embodiment.

As enlarged in FIG. 16, it is possible to use a material obtained by changing steatite or the like which is lyophobic to an IPA to have a form of a sponge, that is, a porosity. In order to obtain such a material, it is preferable that an additive for performing a change to have the porosity should be added when molding the steatite into a shape of the pan 82, for example. By regulating the amount of the additive, a diameter of a very small hole included in the porosity can be increased to about 0.1 $\mu$m. Consequently, a gas permeability, that is, a ventilation efficiency can fully be increased.

The pan 82 is permeable to a gas. Therefore, a flow 84 of an upward IPA vapor which is generated from an IPA 7 is not obstructed by the pan 82 but goes toward an object to be processed such as a semiconductor wafer 3 which is positioned above the pan 82 as shown in FIGS. 15 and 16. Consequently, the efficiency of condensation on the object to be processed can be enhanced and nonuniformity of the flow of the IPA vapor 5 surrounding the object to be processed can be eliminated or relieved. Therefore, defective dryness and nonuniformity of dryness can be prevented.

Since the pan 82 is impermeable to a liquid, an IPA 83 falling from a surface of the object to be processed such as the semiconductor wafer 3 is held by the pan 82 and is discharged to an outside of a processing vessel 11 through a pipe 20. In other words, the pan 82 does not obstruct the flow 84 of the IPA vapor without losing original functions as a pan.

By using the pan 82 for apparatus having a structure to positively form the flow of the IPA vapor 5 going toward the object to be processed such as the semiconductor wafer 3, that is, the drying apparatus 102 and 105, their advantages can particularly be developed remarkably.

Figure 17:
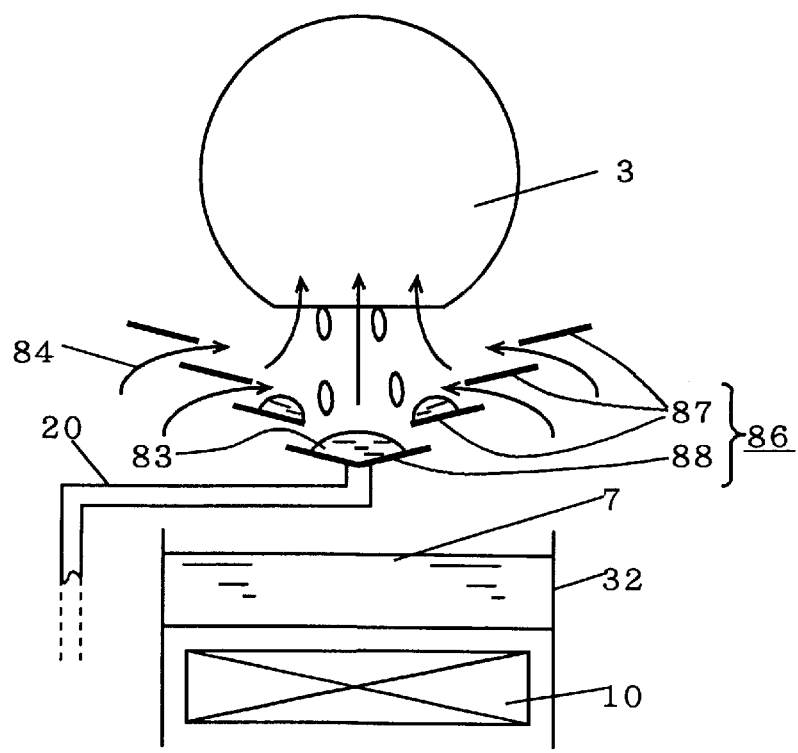
FIG. 17 is a partially enlarged sectional view showing an apparatus according to a tenth embodiment.

FIG. 17 is a front sectional view showing another preferred example of a structure of a pan which acts as a part of a drying apparatus according to a tenth embodiment, that is, a pan which can be used as the pans 6 and 166 of the drying apparatus 101 to 108 and 151. A pan 86 includes a plate-shaped storing member (first plate) 88 bent to have a V - type section such that a liquid can be stored, and a plurality of plate-shaped liquid collecting members (second plates) 87 arranged symmetrically on both sides of the storing member 88 and arranged in a plurality of stages at regular intervals such that a part thereof overlaps vertically.

The liquid collecting members 87 are arranged diagonally such that those in higher stages occupy more distant positions from the storing member 88 horizontally. In other words, the storing member 88 and the liquid collecting members 87 are arranged like tiles to have a V - type section as a whole. In addition, each of the liquid collecting members 87 is slanted such that an upper principal plane thereof is turned inward (in a direction in which it approaches the storing member 88).

Consequently, droplets falling to the liquid collecting member 87 in any stage are sequentially transmitted to the liquid collecting member 87 in a lower stage and finally reach the storing member 88. To a bottom portion of the storing member 88 is connected a pipe 20 for discharging a liquid stored in the storing member 88 to an outside of a processing vessel 11.

Since the pan 86 has the above-mentioned structure, a flow 84 of an upward IPA vapor which is generated from an IPA 7 passes through a gap between the storing member 88 and the liquid collecting members 87 and goes toward an object to be processed such as a semiconductor wafer 3 which is positioned above the storing member 88 and the liquid collecting members 87 as shown in FIG. 17. In other words, the pan 86 does not obstruct the flow 84 of the IPA vapor. Consequently, an efficiency of condensation on the object to be processed can be enhanced and nonuniformity of a flow of an IPA vapor 5 surrounding the object to be processed can be eliminated or relieved. Therefore, defective dryness and nonuniformity of dryness can be prevented.

An IPA 83 falling from a surface of the object to be processed such as the semiconductor wafer 3 finally reaches the storing member 88 and is then discharged to the outside of the processing vessel 11 through the pipe 20. In other words, the pan 86 does not obstruct the flow 84 of the IPA vapor without losing original functions as a pan.

By using the pan 86 for apparatus having a structure to positively form the flow of the IPA vapor 5 going toward the object to be processed such as the semiconductor wafer 3, that is, the drying apparatus 102 and 105 in the same manner as the above-mentioned pan 82 (FIGS. 15 and 16), their advantages can particularly be developed remarkably. In other words, the pan 86 is particularly suitable for the drying apparatus 102 and 105.

Figure 18:
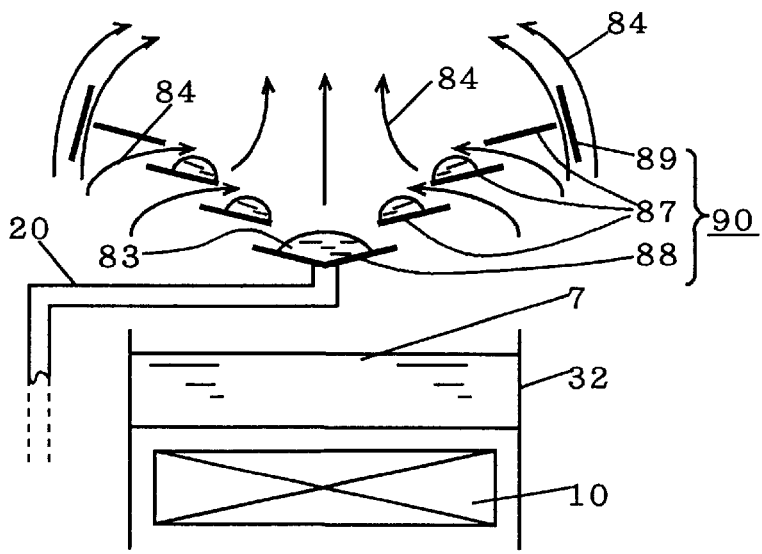
FIG. 18 is a partially enlarged sectional view showing another example of the apparatus according to the tenth embodiment.

FIG. 18 is a front sectional view showing a more preferable example of a structure of the pan 86. A pan 90 is characteristically different from the pan 86 in that a plate-shaped rectifying member 89 is provided on an outside of the liquid collecting member 87 in an uppermost stage (on a side which is the most distant from the storing member 88). The rectifying member 89 is slanted such that the flow of the IPA vapor going upward from a liquid level of the IPA 7 can converge in a direction of the object to be processed such as the semiconductor wafer 3, that is, in a direction of a central portion of the pan 90.

The pan 90 is provided with the rectifying member 89 having the abovementioned structure. Therefore, the flow 84 of the IPA vapor converges on the object to be processed without diffusing away from the object to be processed horizontally. As a result, the efficiency of the IPA vapor 5 condensing on the object to be processed is further increased. Accordingly, the defective dryness and the nonuniformity of the dryness can be prevented more effectively.

Figure 19:
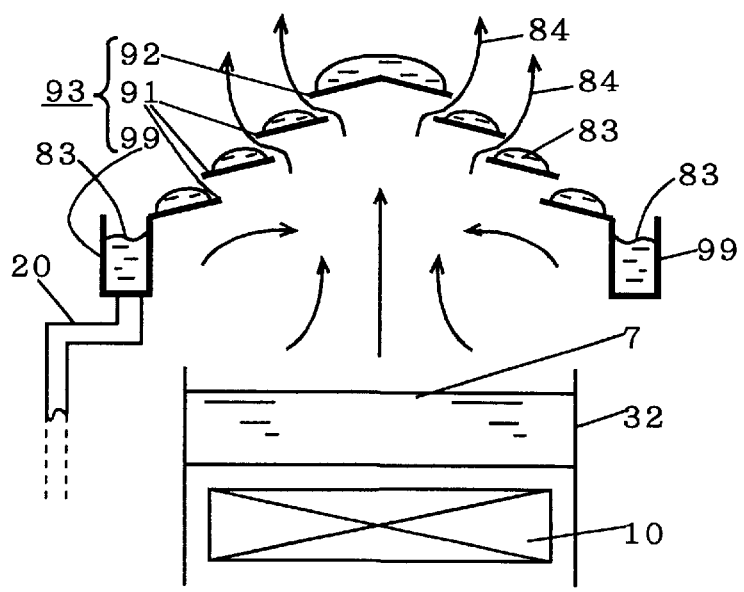
FIG. 19 is a partially enlarged sectional view showing yet another example of the apparatus according to the tenth embodiment.

FIG. 19 is a front sectional view illustrating a further form of the pan having plate-shaped liquid collecting members arranged in a plurality of stages. A pan 93 includes a plate-shaped vertex member (first plate) 92 which is bent to have an inverted V - type section such that a falling liquid can be distributed to both sides, a plurality of plate-shaped liquid collecting members (second plates) 91 arranged symmetrically on both sides of the vertex member 92 and arranged in a plurality of stages at regular intervals such that a part thereof overlaps vertically, and a groove-shaped storing member 99 which is connected to the liquid collecting member 91 positioned in a lowermost stage and can store a liquid.

The liquid collecting members 91 are arranged diagonally such that those in lower stages occupy more distant positions from the vertex member 92 horizontally. In other words, the vertex member 92 and the liquid collecting members 91 are arranged like tiles to have an inverted V - type section as a whole. In addition, each of the liquid collecting members 91 is slanted such that an upper principal plane thereof is turned outward (in a direction in which it keeps away from the vertex member 92).

Consequently, droplets falling to the vertex member 92 and the liquid collecting member 91 in each stage are sequentially transmitted to the liquid collecting member 91 in a lower stage and finally reach the storing member 99. To a bottom portion of the storing member 99 is connected a pipe 20 for discharging a liquid stored in the storing member 99 to an outside of a processing vessel 11.

Since the pan 93 has the above-mentioned structure, a flow 84 of an upward IPA vapor which is generated from an IPA 7 passes through a gap between the vertex member 92 and the liquid collecting members 91 and goes toward an object to be processed such as a semiconductor wafer 3 which is positioned above the vertex member 92 and the liquid collecting members 91 as shown in FIG. 19. An IPA 83 falling from a surface of the object to be processed finally reaches the storing member 99 and is then discharged to the outside of the processing vessel 11 through the pipe 20.

In the same manner as the pan 86, the pan 93 does not obstruct the flow 84 of the IPA vapor without losing original functions as a pan but contributes to prevent the defective dryness and the nonuniformity of the dryness. In the same manner as the pan 86, the pan 93 is particularly suitable for the drying apparatus 102 and 105.

In the pans 86, 90 and 93 illustrated in FIGS. 17 to 19, the members 87, 88, 91 and 92 are, preferably, formed of a material which is permeable to a gas and impermeable to a liquid in the same manner as the pan 82 according to the ninth embodiment. Consequently, the efficiency of the IPA vapor condensing on the object to be processed can further be increased.

Figure 20:
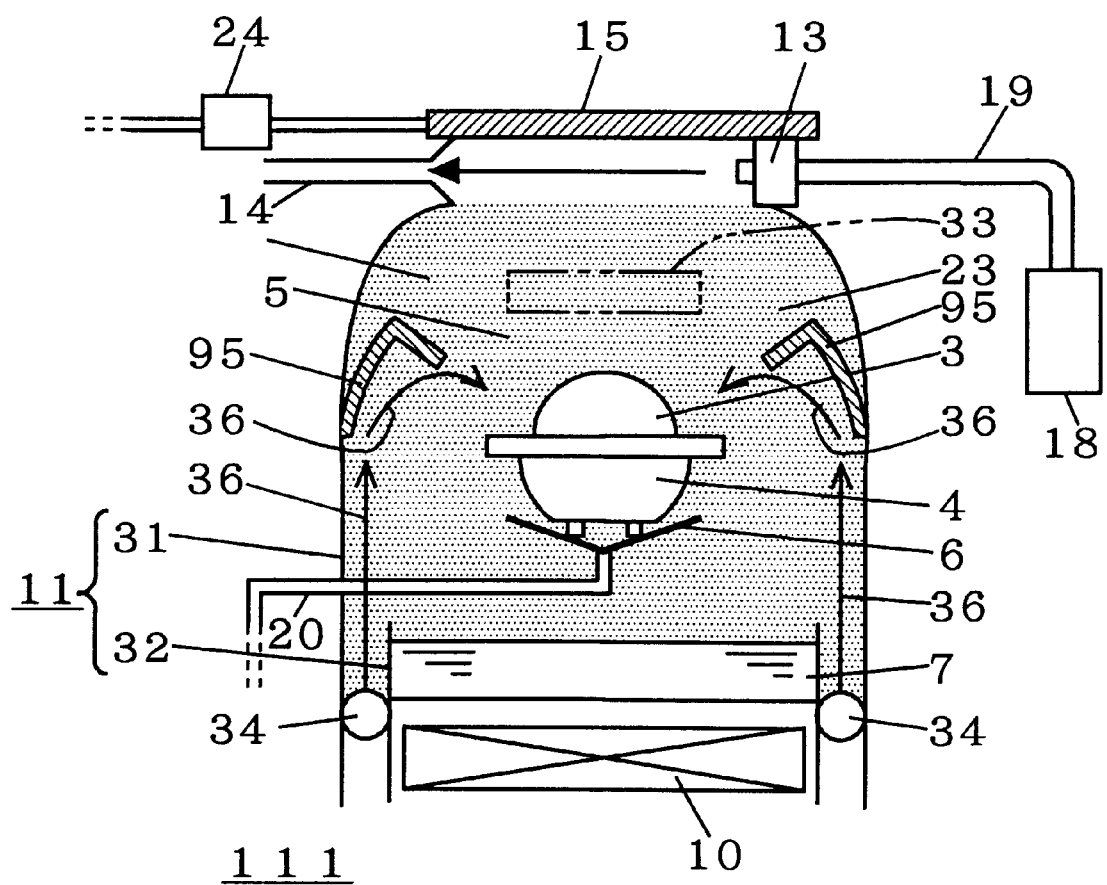
FIG. 20 is a front sectional view showing an apparatus according to an eleventh embodiment.

FIG. 20 is a front sectional view showing a structure of a drying apparatus according to an eleventh embodiment. A drying apparatus 111 is characteristically different from the drying apparatus 101 in that a rectifying member 95 is provided. The rectifying member 95 is fixed to an internal wall of a vapor filling section 31, and is provided above a nozzle 34. The rectifying member 95 is plate-shaped, and is curved or bent such that a direction of a jet 36 of a gas spouted upward from the nozzle 34 can be changed to a direction of an object to be processed such as a semiconductor wafer 3.

More specifically, the jet 36 of a nitrogen gas or the like which is spouted from the nozzle 34 goes up along the internal wall of the vapor filling section 31, and then changes a direction thereof along a principal plane of the rectifying member 95 toward the object to be processed such as the semiconductor wafer 3. The jet 36 passes around the object to be processed and is then collected by a suction port 33. As a result, an efficiency of an IPA vapor 5 condensing on the object to be processed can further be enhanced. Accordingly, defective dryness and nonuniformity of dryness can be prevented more effectively.

Figure 21:
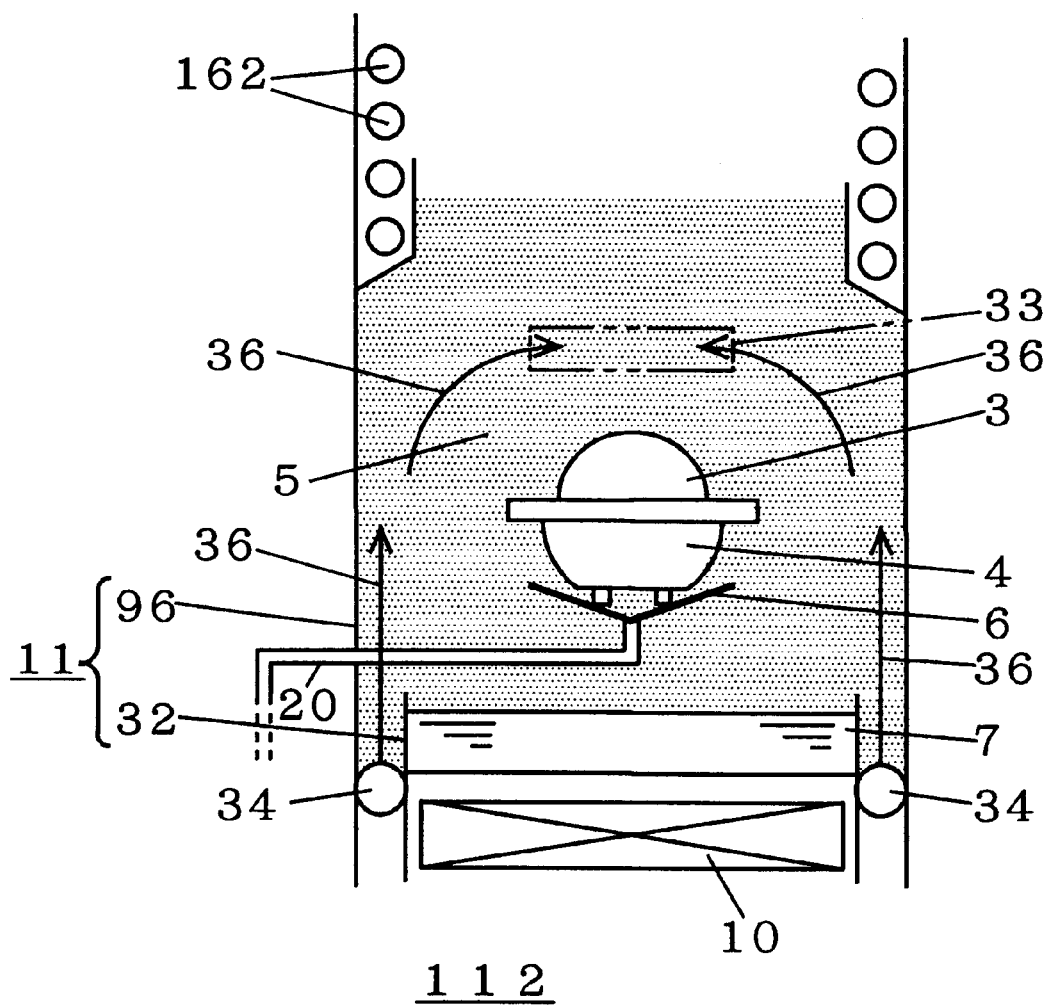
FIG. 21 is a front sectional view showing a variant of the apparatus.

As described in the introduction, features of the first to eleventh embodiments can be combined with the drying apparatus 151 according to the prior art. One of examples will be described below. FIG. 21 is a front sectional view showing an example in which the nozzle 34 and the suction port 33 which are the features of the first embodiment are provided in the drying apparatus 151 according to the prior art.

A drying apparatus 112 comprises a vapor filling section 96 having an upper end opened. A cooling coil 162 is fixed to an inside of an upper portion of a side wall of the vapor filling section 96 along the side wall. The suction port 33 is formed below the cooling coil 162 in the proximity thereof. Differently from the drying apparatus 101, the nozzle 13 and the exhaust member 14 are not provided. In the drying apparatus 112, the cooling coil 162 forms diffusion preventing means.

Also in the drying apparatus 112 having such a structure, the nozzle 34 and the suction port 33 are provided. As compared with the drying apparatus 151 according to the prior art, therefore, an efficiency of an IPA vapor condensing on an object to be processed such as a semiconductor wafer 3 can be increased more and defective dryness can be prevented more.

While the invention has been described in detail, the foregoing description is in all aspects illustrative and not restrictive. It is understood that numerous other modifications and variations can be devised without departing from the scope of the invention.

We claim:

1. A driving apparatus for storing and heating a water-soluble solvent, and causing a vapor generated from said solvent to condense on a surface of an object to be processed, thereby drying said surface of said object, which comprises:

a processing vessel defining on a top portion thereof an upward opening through which said object is respectively positionable and removable, said vessel storing said solvent in a bottom portion thereof and housing said object above said stored solvent;

a heater heating said solvent stored in said bottom portion of said processing vessel;

a diffusion preventing device for preventing said vapor from diffusing from an inside portion of said processing vessel to an outside portion thereof through said opening; and a nozzle generating a flow of a gas to cover an inner surface of a side wall of said processing vessel along said inner surface on receipt of a supply of said gas, wherein said processing vessel further defines on said side wall a suction port for collecting said gas which has flowed along said inner surface wherein said nozzle is provided in a lower portion of said side wall and said suction port is defined in an upper portion of said side wall such that said gas is collectible by said suction port after flowing so as to cover said inner surface from a lower portion to an upper portion along said inner surface.

2. A drying apparatus for storing and heating a water-soluble solvent, and causing a vapor generated from said solvent to condense on a surface of an object to be processed, thereby drying said surface of said object, which comprises:

a processing vessel defining on a top portion thereof an upward opening through which said object is respectively positionable and removable, said vessel storing said solvent in a bottom portion thereof and housing said object above said stored solvent;

a heater heating said solvent stored in said bottom portion of said processing vessel;

a diffusion preventing device for preventing said vapor from diffusing from an inside portion of said processing vessel to an outside portion thereof through said opening; and a nozzle generating a flow of a gas to cover an inner surface of a side wall of said processing vessel along said inner surface on receipt of a supply of said gas, wherein said processing vessel further defines on said side wall a suction port for collecting said gas which has flowed along said inner surface said nozzle is provided in an upper portion of said side wall, and said suction port is defined in said upper portion of said side wall such that said gas is collectable by said suction port through a portion in which said object is housed after flowing so as to cover said inner surface from an upper portion to a lower portion along said inner surface.

3. A drying apparatus for storing and heating a water-soluble solvent, and causing a vapor generated from said solvent to condense on a surface of an object to be processed, thereby drying said surface of said object, which comprises:

a processing vessel defining on a top portion thereof an upward opening through which said object is respectively positionable and removable, said vessel storing said solvent in a bottom portion thereof and housing said object above said stored solvent;

a heater heating said solvent stored in said bottom portion of said processing vessel;

a diffusion preventing device for preventing said vapor from diffusing from an inside portion of said processing vessel to an outside portion thereof through said opening; and a nozzle generating a flow of a gas to cover an inner surface of a side wall of said processing vessel along said inner surface on receipt of a supply of said gas, wherein said processing vessel further defines on said side wall a suction port for collecting said gas which has flowed along said inner surface, and a suction device and mixed gas generating device wherein said suction device is positioned between said suction port and said mixed gas generating device and applies suction to said inside of said processing vessel through said suction port, and said mixed gas generating device is inserted between said suction device and said nozzle, feeds a mixed gas of a nonreactive gas and said vapor as said gas to said nozzle, and increases a concentration of said vapor in said mixed gas sucked by said suction device and thereafter feeds said mixed gas to said nozzle.

4. The drying apparatus as defined in claim 3, wherein said heater comprises a first heater and which comprises a mixed gas pipe inserted between said mixed gas generating device and said nozzle for delivering said mixed gases; and a second heater provided separately from said first heater and is fixed to said mixed gas pipe for heating said mixed gas delivered through said mixed gas pipe.

5. The drying apparatus as defined in claim 4, wherein said mixed gas generating device includes a mixing vessel storing said solvent, and a third heater heating said solvent stored in said mixing vessel to generate a vapor of said solvent; and said mixing vessel mixes said vapor generated from said solvent stored in said mixing vessel into said mixed gas sucked by said suction device, thereby increasing said concentration of said vapor in said mixed gas, said drying apparatus further comprising:

a concentration sensor for detecting said concentration of said vapor in said mixed gas passing through said suction port; and a control device for controlling heat outputs of said first, second and third heaters so as to eliminate deviation from a target value of said concentration detected by said concentration sensor.

6. The drying apparatus as defined in claim 5, wherein said control device controls a suction output of said suction device in addition to said heat outputs of said first, second and third heaters so as to eliminate said deviation from said target value of said concentration detected by said concentration sensor.

7. The drying apparatus as defined in claim 1, further comprising a rectifying member fixed to said side wall for changing a direction of said flow such that said gas goes toward a portion in which said object is housed after flowing so as to cover said inner surface from said lower portion to said upper portion along said inner surface.

8. A drying apparatus for storing and heating a water-soluble solvent, and causing a vapor generated from said solvent to condense on a surface of an object to be processed, thereby drying said surface of said object, which comprises:

a processing vessel defining on a top portion thereof an upward opening through which said object is respectively positionable and removable, said vessel storing said solvent in a bottom portion thereof and housing said object above said stored solvent;

a heater heating said solvent stored in said bottom portion of said processing vessel;

a diffusion preventing device for preventing said vapor from diffusing from an inside portion of said processing vessel to an outside portion thereof through said opening; and a nozzle generating a flow of a gas to cover an inner surface of a side wall of said processing vessel along said inner surface on receipt of a supply of said gas, wherein said processing vessel further defines, on said side wall, a suction port for collecting said gas which has flowed along said inner surface wherein said nozzle includes a plurality of pipes combined in a plurality of ways from an inside portion to an outside portion thereof, each of said pipes defines a plurality of jet holes arranged along a central axis so that said gas fed to an innermost pipe is sequentially fed to outer pipes through said jet holes and is spouted along said inner surface of said side wall through said jet holes defined on an outermost pipe, and said jet holes defined between one of said pipes and an outer pipe thereof are provided opposite one another.

9. A drying apparatus for storing and heating a water-soluble solvent, and causing a vapor generated from said solvent to condense on a surface of an object to be processed, thereby drying said surface of said object, which comprises:

a processing vessel defining on a top portion thereof an upward opening through which said object is respectively positionable and removable, said vessel storing said solvent in a bottom portion thereof and housing said object above said stored solvent;

a heater heating said solvent stored in said bottom portion of said processing vessel;

a diffusion preventing device for preventing said vapor from diffusing from an inside portion of said processing vessel to an outside portion thereof through said opening; and a nozzle generating a flow of a gas to cover an inner surface of a side wall of said processing vessel along said inner surface on receipt of a supply of said gas, wherein said processing vessel further defines, on said side wall, a suction port for collecting said gas which has flowed along said inner surface, and wherein said nozzle comprises a first nozzle and said gas comprises a first gas, and a second nozzle for spouting a second gas into said solvent stored in said processing vessel to bubble said solvent on receipt of a supply of said second gas.

10. The drying apparatus as defined in claim 9, wherein said second nozzle is divided into a plurality of unit nozzles.

11. The drying apparatus as defined in claim 9, wherein said first nozzle and said second nozzle communicate with each other so that a common gas can be fed as said first and second gas to said first and second nozzles, respectively, at the same time.

12. A drying apparatus for storing and heating a water-soluble solvent, and causing a vapor generated from said solvent to condense on a surface of an object to be processed, thereby drying said surface of said object, which comprises:

a processing vessel defining, on a top portion thereof, an upward opening through which said object is respectively positionable and removable, said vessel storing said solvent in a bottom portion thereof and housing said object above said stored solvent;

a heater heating said solvent stored in said bottom portion of said processing vessel;

a diffusion preventing device for preventing said vapor from diffusing from an inside portion of said processing vessel to an outside portion thereof through said opening; and a nozzle generating a flow of a gas to cover an inner surface of a side wall of said processing vessel along said inner surface on receipt of a supply of said gas, wherein said processing vessel further defines, on said side wall, a suction port for collecting said gas which has flowed along said inner surface wherein said diffusion preventing device includes a spouting device and an exhaust device provided opposite one another with said opening interposed therebetween and wherein said gas comprises a first gas, said exhaust device defining an exhaust port for opening toward said spouting device, said spouting device generating a jet of a second gas going toward said exhaust port and covering said opening on receipt of a supply of said second gas, said exhaust device discharging, to an outside area, said second gas sucked through said exhaust port, and said side wall of said processing vessel has a curved portion which is smoothly curved inwardly as said opening is approached upwardly.

13. The drying apparatus as defined in claim 12, wherein said diffusion preventing means further includes a cap for freely covering said opening.

14. A drying apparatus for storing and heating a water-soluble solvent, and causing a vapor generated from said solvent to condense on a surface of an object to be processed, thereby drying said surface of said object, which comprises:

a processing vessel defining on a top portion thereof an upward opening through which said object is respectively positionable and removable, and storing said solvent in a bottom portion thereof and housing said object above said stored solvent;

a heater for heating said solvent stored in said bottom portion of said processing vessel;

a diffusion preventing device for preventing said vapor from diffusing from an inside portion of said processing vessel to an outside portion thereof through said opening;

a pan provided under said object which is housed in said processing vessel, and above a liquid level of said stored solvent; and a pipe coupled to a bottom portion of said pan for discharging a liquid poured into said pan to an outside portion of said drying apparatus, wherein said pan is formed of a material which is permeable to a gas and impermeable to a liquid.

15. The drying apparatus as defined in claim 14, wherein said pan includes a first flat plate which is bent to have one of a V - type section and an inverted V - type section, and a plurality of second flat plates arranged on both sides of said first plate symmetrically around said first plate at regular intervals so as to respectively have said one of said V - type section and said inverted V-type section as a whole including said first plate.

16. The drying apparatus as defined in claim 15, wherein said pan further comprises a rectifying member fixed outside said second plates provided in an outermost position from said first plate for causing a flow of said vapor going upwardly from a space below said pan to converge.

17. The drying apparatus as defined in claim 14, which comprises a nozzle for generating a flow of a gas to cover an inner surface of a side wall of said processing vessel along said inner surface upon receipt of a supply of said gas, wherein said processing vessel further defines, on said side wall, a suction port collecting said gas after flowing along said inner surface, and said nozzle is provided in an upper portion of said side wall and said suction port is defined in said upper portion of said side wall such that said gas is collectible by said suction port through a portion in which said object is housed after flowing so as to cover said inner surface from said upper portion to a lower portion along said inner surface.

18. The drying apparatus as defined in claim 14, which comprises a nozzle for spouting a gas into said solvent stored in said processing vessel so as to bubble said solvent on receipt of a supply of said gas, wherein said processing vessel further defines, on a side wall thereof, a suction port for collecting said gas after bubbling.

* * * * *

UNITED STATES PATENT AND TRADEMARK OFFICE
CERTIFICATE OF CORRECTION

PATENT NO. : 5,956,859

DATED : September 28, 1999

INVENTOR(S): Akinori MATSUMOTO, et al.

It is certified that an error appears in the above-identified patent and that said Letters Patent is hereby corrected as shown below:

On the title page, item [73], the first assignee's name should be:

--Ryoden Semiconductor System Engineering Corporation--

Signed and Sealed this

Fifteenth Day of August, 2000

Attest:

Q. TODD DICKINSON

*Attesting Officer*  *Director of Patents and Trademarks*